US006753947B2

(12) United States Patent
Meisburger et al.

(10) Patent No.: US 6,753,947 B2
(45) Date of Patent: Jun. 22, 2004

(54) LITHOGRAPHY SYSTEM AND METHOD FOR DEVICE MANUFACTURE

(75) Inventors: Dan Meisburger, San Jose, CA (US); David A. Markle, Saratoga, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/854,226

(22) Filed: May 10, 2001

(65) Prior Publication Data

US 2002/0186359 A1 Dec. 12, 2002

(51) Int. Cl.[7] ........................ G03B 27/72; G03B 27/42; G03B 27/32; A61N 5/00; G03C 5/00
(52) U.S. Cl. .................... 355/69; 355/53; 355/77; 355/60; 355/55; 355/67; 356/399; 356/400; 356/401; 250/548; 250/492.2; 430/30
(58) Field of Search ...................... 355/69, 53, 77, 355/55, 60, 67; 356/399, 400, 401; 250/548, 492.2; 430/30

(56) References Cited

U.S. PATENT DOCUMENTS

| | | | |
|---|---|---|---|
| 4,095,891 A | | 6/1978 | Lovering .................. 355/50 |
| 4,980,718 A | | 12/1990 | Salter et al. .............. 355/53 |
| 4,980,896 A | * | 12/1990 | Forsyth et al. |
| 5,077,774 A | * | 12/1991 | Piestrup et al. |
| 5,281,996 A | | 1/1994 | Bruning et al. ........... 355/77 |
| 5,385,633 A | * | 1/1995 | Russell et al. |
| 5,523,193 A | * | 6/1996 | Nelson |
| 5,523,543 A | * | 6/1996 | Hunter, Jr. et al. |
| 5,633,735 A | * | 5/1997 | Hunter, Jr. et al. |
| 5,672,464 A | * | 9/1997 | Nelson |
| 5,699,185 A | * | 12/1997 | MacDonald et al. |
| 5,880,817 A | * | 3/1999 | Hashimoto |
| 5,987,042 A | | 11/1999 | Staver et al. ............. 372/30 |
| 6,080,148 A | | 6/2000 | Damasco et al. .......... 606/10 |
| 6,151,345 A | | 11/2000 | Gray ...................... 372/38 |
| 6,172,325 B1 | | 1/2001 | Baird et al. ............ 219/121.62 |
| 6,198,069 B1 | * | 3/2001 | Hackel et al. |
| 6,304,319 B1 | * | 10/2001 | Mizutani |
| 6,399,261 B1 | * | 6/2002 | Sandstrom |

OTHER PUBLICATIONS

Levinson, et al., The Factors Which Determine the Optimum Reduction Factor For Wafer Steppers, SPIE–Int. Soc. Opt. Eng. Proceedings of SPIE—The International Society for Optical Engineering, vol. 3677, part one of two, 1999, pp. 468–478.

(List continued on next page.)

Primary Examiner—Sandra O'Shea
Assistant Examiner—Khaled Brown
(74) Attorney, Agent, or Firm—Allston L. Jones

(57) ABSTRACT

A lithography system and method for cost-effective device manufacture that can employ a continuous lithography mode of operation is disclosed, wherein exposure fields are formed with single pulses of radiation. The system includes a pulsed radiation source (14), an illumination system (24), a mask (M), a projection lens (40) and a workpiece stage (50) that supports a workpiece (W) having an image-bearing surface (WS). A radiation source controller (16) and a workpiece stage position system (60), which includes a metrology device (62), are used to coordinate and control the exposure of the mask with radiation pulses so that adjacent radiation pulses form adjacent exposure fields (EF). Where pulse-to-pulse uniformity from the radiation source is lacking, a pulse stabilization system (18) may be optionally used to attain the desired pulse-to-pulse uniformity in exposure dose. The rapidity at which exposures can be made using a single radiation pulse allows for a very high throughput, which in turn allows for a small-image-field projection lens to be utilized in a cost-effective manner in the manufacture of devices such as semiconductor integrated circuits and the like. The system can also be used in the conventional "step-and-repeat" mode of operation, so that the system owner can decide the most cost-effective mode of operation for any given application.

100 Claims, 12 Drawing Sheets

OTHER PUBLICATIONS

Bruning, Optical Lithography—Thirty Years and Three Orders of Magnitude: The Evolution of Optical Lithography Tools, SPIE–Int. Soc. Opt. Eng. Proceedings of SPIE—The International Society for Optical Engineering, vol. 3049, 1997, pp. 14–27.

Markle, The Future and Potential of Optical Scanning Systems, Solid State Technology, vol. 27, No. 9, Sep. 1984, pp. 159–166.

Pol, et al., Excimer Laser Based Lithography: a Deep–ultraviolet Wafer Stepper for VLSI Processing, Optical Engineering, vol. 26, No. 4, Apr. 1987, pp. 311–318.

Kuwabara, et al., An Excimer Laser Stepper With Through–The–Lens Alignment, Journal of the Japan Society of Precision Engineering/Seimitsu Kogaku Kaishi, vol. 59, No. 8, Aug. 1993, pp. 1257–1262, Japan.

* cited by examiner

TIME

LITHOGRAPHY SYSTEM AND METHOD FOR DEVICE MANUFACTURE

FIELD OF THE INVENTION

The present invention pertains to lithography, and in particular pertains to a system for and method of rapidly and cost-effectively performing lithographic exposures in the manufacture of devices.

BACKGROUND OF THE INVENTION

The process of manufacturing certain micro-devices such as semiconductor integrated circuits (ICs), liquid crystal displays, micro-electro-mechanical devices (MEMs), digital mirror devices (DMDs), silicon-strip detectors and the like involves the use of high-resolution lithography systems. In such systems, a patterned mask (i.e., a reticle) is illuminated with radiation (e.g., laser radiation or radiation from an arc lamp) that passes through an illumination system that achieves a high-degree of illumination uniformity over the illuminated portion of the mask. The portion of the radiation passing through the mask is collected by a projection lens, which has an image field (also referred to as a "lens field") of a given size. The projection lens images the mask pattern onto an image-bearing workpiece. The workpiece resides on a workpiece stage that moves the workpiece relative to the projection lens, so that the mask pattern is repeatedly formed on the workpiece over multiple "exposure fields."

Lithography systems include an alignment system that precisely aligns the workpiece with respect to the projected image of the mask, thereby allowing the mask to be exposed over a select region of the workpiece. In most cases, the mask image needs to be precisely aligned to a pre-existing exposure field on the workpiece to provide the juxtaposed registration necessary to build up layers of the device being fabricated.

Presently, two types of lithography systems are used in manufacturing: step-and-repeat systems, or "steppers," and step-and-scan systems, or "scanners." With steppers, each exposure field on the workpiece is exposed in a single static exposure. With scanners, the workpiece is exposed by synchronously scanning the work piece and the mask across the lens image field. An exemplary scanning lithography system and method is described in U.S. Pat. No. 5,281,996. The projection lenses associated with steppers and scanners typically operate at 1× (i.e., unit magnification), or reduction magnifications of 4× or 5× (i.e., magnifications of ±¼ and ±⅕, as is more commonly expressed in optics terminology).

The ability of a lithography system to resolve (or, more accurately, "print") features of a given size is a function of the exposure wavelength: the shorter the wavelength, the smaller the feature that can be printed or imaged. To keep pace with the continuously shrinking minimum feature size for many micro-devices (particularly for ICs), the exposure wavelength has been made shorter. Also, historically the device size has increased as well, so that the lens field size has steadily grown. The resolution of the lithography system also increases with the numerical aperture (NA) of the projection lens. Thus, in combination with reducing the exposure wavelength, the numerical apertures of projection lenses tend to be as large as can be practically designed, with the constraint that the depth of focus, which decreases as the square of the NA, be within practical limits.

Until fairly recently, semiconductor industry roadmaps predicted that lithography system field sizes would continue to increase to accommodate the increasing overall device size of memory and micro-processor chips. This trend has significant cost implications for manufacturing. In the case of smaller circuits, multiple devices would be fitted into a single exposure field. Although devices have generally grown in size, they have not grown as fast as anticipated by the industry roadmap makers, and the size of the minimum features used in the devices has shrunk faster than originally expected. The field sizes of the current generation of step-and-scan systems is more than adequate for the next few generations of memory, but the rapidly shrinking minimum geometry sizes are making it very difficult to obtain masks.

In order to provide some relief to the mask makers, the latest International Technology Roadmap update shows a minimum lens image field size of 25 mm×32 mm through 2003 changing to 22 mm×26 mm for 2004 through 2013. This decrease in the required field size allows the reduction magnification to be increased from 4× to 5×, thus providing relief to the mask maker.

State-of-the-art lithography systems constitute some of the most complex machinery ever built, and as a consequence, are extremely expensive. Also, a good deal of effort and expense is also required to maintain and service lithography systems in the manufacturing environment. While it is relatively easy to build various kinds of experimental lithography systems in the laboratory for research and development purposes, it is an immense challenge to develop a lithography system for manufacturing purposes that is affordable and that operates in a cost-effective manner as determined by "cost-of-ownership" considerations.

Choices between different types of lithography equipment are generally made on the basis of their relative cost-of-ownership. This cost-based model takes into account the cost of procuring, operating and maintaining a given lithography system in a manufacturing environment. The cost-of-ownership is determined by considering various factors that relate directly to the properties of the lithography system and how the system is used in the manufacturing environment. There are a number of sophisticated cost-of-ownership models, an example being the SEMATECH Lithography Cost of Ownership Model, which take into account scores of different factors in performing the cost-of-ownership calculation. However, reliable cost-of-ownership trends can be obtained by examining a few key factors, such as stepper cost, mask cost, field size, system throughput (defined below), and the number of workpieces processed for a given mask.

It is known that the cost of the projection lens and illuminator for a lithographic system increases roughly as the cube of the lens field size. The cost of a state-of-the-art stepper having a lens capable of 0.13 micron resolution and operable at a 193 nm exposure wavelength with a field size of 22 mm×22 mm is roughly divided evenly between the lens and the rest of the system. The latter includes, the mask and wafer handling systems, the mask and workpiece stages, the laser exposure source, alignment systems, etc. Integrating all of these components into a usable system with installation and warranty leads to system prices of between about $10 M and $20 M.

Lithography system "throughput" (i.e., the number of workpieces capable of being processed per hour) is one of the most significant factors in the cost-of-ownership calculation. To first order, the throughput of a conventional lithography system increases as the square of the exposure field size (diameter). Historically, throughput has been limited in part by the brightness of the radiation source, which must deliver a sufficiently high and uniform dose of radiation to the wafer for every exposure field. However present-day radiation sources are typically narrow-band, pulsed excimer lasers operating at 2000–4000 Hz and are far brighter than the arc sources used previously. The pulse-to-pulse uniformity of a typical excimer laser suitable for use in lithography is quite poor, i.e., 8–10% (3σ).

As lithography systems typically require illumination uniformity over the mask of less than 1% (3σ), numerous (e.g., 100) pulses from the radiation source are averaged together to achieve the required uniformity. With laser repetition rates of several thousand hertz, the exposure times of step-and-scan systems have been reduced considerably so that the throughput rate of current lithography systems is primarily limited by stage motion and settling times (for steppers) and acceleration and scanning times (for step-and-scan systems). Reticle stage turn-around time, including settling and overscan, takes about 140 ms for each field for a modern step-and-scan system. This is similar to a stepper's wafer stage move-and-settle time. In a step-and-scan system, the most difficult kinetic problems are usually encountered in the mask stage, which must accelerate and move X times faster than the wafer in proportion to the magnification reduction ratio X.

Another significant cost associated with a lithography system is that of the mask. The mask cost is roughly proportional to the square of the lens field size (diameter). This determines the amount of information embedded in the mask and therefore the write times, the inspection times and the probable number of defects. In certain applications, such as high-volume DRAM or microprocessor manufacture, the cost of the mask is a minor expense compared to the cost of depreciating the lithography system. However, for special-ized ("foundry") applications, (e.g., the making of specialty devices such as digital signal processors, customized control circuits, etc.), the mask cost dominates the cost of lithography. A set 30 of masks for a foundry application may cost $1,000,000 or more, including the cost of the blanks, pellicles, set-up, writing, inspection and repair.

The numbers of workpieces per mask (WPM) to be run on a given lithography system is another key cost-of-ownership factor. The WPM can vary from 3 to 3,000 in a foundry application. The point where mask costs and lithography tool depreciation cost become equal depends on a variety of factors. As a general rule, for a lithography system having a large field size (e.g., 22 mm×22 mm) and running 3000 WPM or less, the cost-of-ownership is dominated by the mask costs.

The industry trend and conventional wisdom has been to design lithography systems to optimally serve the DRAM (memory) and microprocessor segments of the industry. With either step-and-repeat or step-and-scan technologies, these large segments of the industry are well served, and achieve the lowest cost-of-ownership with the field sizes recommended in the International Technology Roadmap. Other applications, which might be better served with systems having more modest field sizes, have generally been ignored by semiconductor equipment manufactures.

It would be advantageous from a cost-of-ownership viewpoint, for example, to be able to reduce the size of the lens field to some optimum value, taking into account the fact that mask costs dominate many applications. However, stepper throughput is roughly proportional to the square of the field size, which tends to offset somewhat, but not entirely, the savings in mask cost that are achieved with smaller field sizes. Also there are always some chips that are very large that could not be contained in the field of a small-field system. To date the added development cost, and the reduced potential market size for a small-field lithography systems has held back the development of such a system despite its cost of ownership advantages. Also the cost-of-ownership advantages of small-field systems are not well known.

Accordingly, what is needed is a lithography system capable of rapidly and cost-effectively exposing wafers in cases where there is less than 3000 workpieces per mask (WPM). A further improvement would be to achieve a high throughput, even where the system utilizes a projection lens with a relatively small lens field.

SUMMARY OF THE INVENTION

The present invention pertains to lithography, and in particular pertains to a system for and method of cost-effectively performing lithographic exposures in the manufacture of devices. The cost-effectiveness is further enhanced by a method of performing lithographic exposures very rapidly.

An aspect of the present invention involves the use of lithography lenses in lithography systems for manufacturing, wherein the lenses have lens (image) field sizes that are substantially smaller than that of conventional lithography systems and which, therefore, allow for the use of masks that contain substantially less information than masks used with conventional systems. Use of a small-field lithographic lens saves a considerable amount of money in the initial price of the lithography system for manufacturing. The savings on the smaller mask depend on the number of substrates to be exposed using the mask, which are appreciable on jobs involving fewer than 3000 substrates per reticle set. Although the smaller lens field size also leads to a lower throughput, the savings in the cost of the lens and on masks more than offsets this disadvantage.

Another aspect of the present invention involves using a novel "continuous lithography" exposure mode. With this mode, it is possible to achieve exposures using single pulses of radiation and eliminate the throughput disadvantage associated with small lens fields. Use of a smaller-than-conventional lens field size facilitates single pulse exposures because the total amount of energy required per pulse is proportional to the exposure area. Thus, a smaller lens field size requires a smaller and therefore less expensive laser or other pulsed radiation source such as a flash lamp. Also the useful life of the lens may be limited by the high energy contained in each radiation pulse. High-energy pulses of deep UV radiation tend to compact glass over an extended period of time and eventually lead to unacceptable wavefront errors in the lens. A smaller lens field size opens up the number of design possibilities to include designs having fewer refractive lens components and more reflective lens elements. Since it is the refractive lens elements that have limited life, a design having fewer refractive elements can generally be expected to have a longer useful life. This makes for a lithography system that allows for the cost-effective use of smaller-than-usual lens (image) fields, which translates into less expensive projection lenses, and more generally, less expensive manufacturing of devices, such as semiconductor integrated circuits and the like.

Accordingly, an aspect of the invention is a lithography system for cost-effectively exposing a workpiece with successive images of a mask to be used to process 3000 substrates or less, and to form a plurality of exposure fields using a burst of radiation pulses to expose each field. The system includes, in order along an optical axis, a radiation source for providing radiation pulses. An illuminator is arranged to receive the pulses of radiation and substantially spread each pulse of radiation uniformly over the mask plane with a spatial uniformity of ±10% or less. Also included is a mask holder capable of supporting a mask to be substantially uniformly illuminated by each burst of radiation pulses exiting the illuminator. The system also includes a projection lens having an object plane arranged at or near the mask, an image plane arranged at or near the workpiece, and an image field within the image plane. The projection lens image field is sized to cover an image area less than half that of conventional lithography systems, so that the mask requires less than half as much detail as a mask used in a conventional lithography system. The projection lens is arranged to receive radiation transmitted by the mask to form a mask image on the workpiece within the image field. A workpiece stage is provided for supporting the workpiece at or near the image plane. The workpiece stage is adapted to step the workpiece so as to allow for a burst of radiation pulses to expose corresponding adjacent exposure fields with the successive mask images.

Another aspect of the invention is a cost-effective lithography system for rapidly exposing a workpiece with successive images of a mask to form a plurality of exposure fields using a single pulse of radiation per exposure field. The system includes, in order along an optical axis, a radiation source for providing pulses of radiation having a pulse-to-pulse uniformity of ±10% or less. An illuminator is arranged to receive the pulses of radiation and spread each pulse of radiation substantially uniformly over the mask plane. Also included is a mask holder capable of supporting a mask to be substantially uniformly illuminated by each pulse of radiation exiting the illuminator. The system also includes a projection lens having an object plane arranged at or near the mask, an image plane arranged at or near the workpiece, and an image field within the image plane. The projection lens is arranged to receive radiation transmitted by the mask to form a mask image on the workpiece within the image field. A workpiece stage is provided for supporting the workpiece at or near the image plane. The workpiece stage is adapted to move the workpiece over a scan path at a velocity that allows for single pulses of radiation to expose corresponding adjacent exposure fields with the successive mask images without appreciably smearing the mask images.

A further aspect of the invention is a pulse stabilization system, which can be arranged downstream of the radiation source to stabilize the pulse-to-pulse uniformity of the radiation pulses from the radiation source.

In another aspect of the invention, the cost-effective lithography system of the present invention includes a radiation source controller operatively connected to the radiation source, and a workpiece stage position controller for controlling the movement of the workpiece stage. The operation of the radiation source and the movement of the workpiece stage are facilitated by a metrology device that measures the precise location of the workpiece stage relative to a reference. The metrology device is electrically connected to the radiation source controller and provides the position information necessary to coordinate the pulses of radiation with the movement of the workpiece over the scan path.

In another aspect of the invention, the workpiece includes an image-bearing surface, and each pulse of radiation has energy sufficient to expose but not ablate the image-bearing surface.

A further aspect of the invention is a method of forming multiple exposure fields on a workpiece with a projection lens. The projection lens has an object plane at which a mask having a pattern is supported, and an image plane with an image field within which a mask image is formed. The method comprises the steps of aligning the workpiece relative to the image field, then irradiating the mask with a plurality of radiation pulses. The radiation pulses preferably have good pulse-to-pulse uniformity (i.e., little variation in exposure dose), i.e., 10% (3σ) or less, and more preferably, 1% (3σ) or less. The pulses also preferably have good spatial uniformity of illumination over the object plane of 10% (3σ) or less, and more preferably 1% (3σ) or less. The method further includes the step of collecting, with the projection lens, the portion of the pulses of radiation that are transmitted by the mask so as to form a separate mask image with each pulse of radiation. During the collecting step, the workpiece is continuously moved over a scan path in the image plane so that each mask image forms a corresponding separate exposure field.

Another aspect of the invention is the above-described method, which further includes the step of aligning the mask image to one or more pre-existing separate exposure fields on the workpiece.

Another aspect of the invention is the above-described method, including the step of sending the radiation pulses through a pulse stabilization system to improve the pulse-to-pulse uniformity.

A further aspect of the invention is a method of rapidly forming a plurality of sequentially arranged exposure fields on a workpiece with a projection lens having an object plane, an image plane and an image field. The method includes the steps of supporting a mask having a pattern at or near the object plane, and arranging a workpiece stage for the workpiece on which the sequentially arranged exposure fields are to be formed, to be movable within the image plane over a scan path relative to the image field. The method also includes irradiating the mask with pulses of radiation and collecting the transmitted radiation with the projection lens to form a mask image within the image field for each radiation pulse. The workpiece stage is moved continuously over the scan path during the mask irradiation so that adjacent radiation pulses form adjacent exposure fields.

Another aspect of the invention is the above-described method, wherein adjacent exposure fields are formed in registered juxtaposition with pre-existing exposure fields formed on the workpiece.

DETAILED DESCRIPTION OF THE INVENTION

The present invention pertains to lithography, and in particular pertains to a system for and method of rapidly and cost-effectively performing lithographic exposures in the manufacture of devices. This design lends itself to an operational mode where each field is exposed with a single pulse of radiation, which is sufficiently brief that the substrate stage can move continuously between successive pulses.

In the description below, an overview of the main elements of the cost-effective lithography system of the present invention is first provided. Then, each of the key elements in the system is described in greater detail, with appropriate emphasis on the differences with conventional lithography systems. A method of using the cost-effective lithography system of the present invention to effect rapid and cost-effective manufacturing of devices is then set forth. The operational mode whereby a field is exposed with a single pulse is referred to herein as the "continuous lithography" mode. The lithography system of the present invention is also called the "continuous lithography" system, even though it can operate in the conventional "step-and-repeat" mode as well.

In the description below and in the Figures, like reference numbers are used for like elements.

Lithography System Overview

Figure 1:
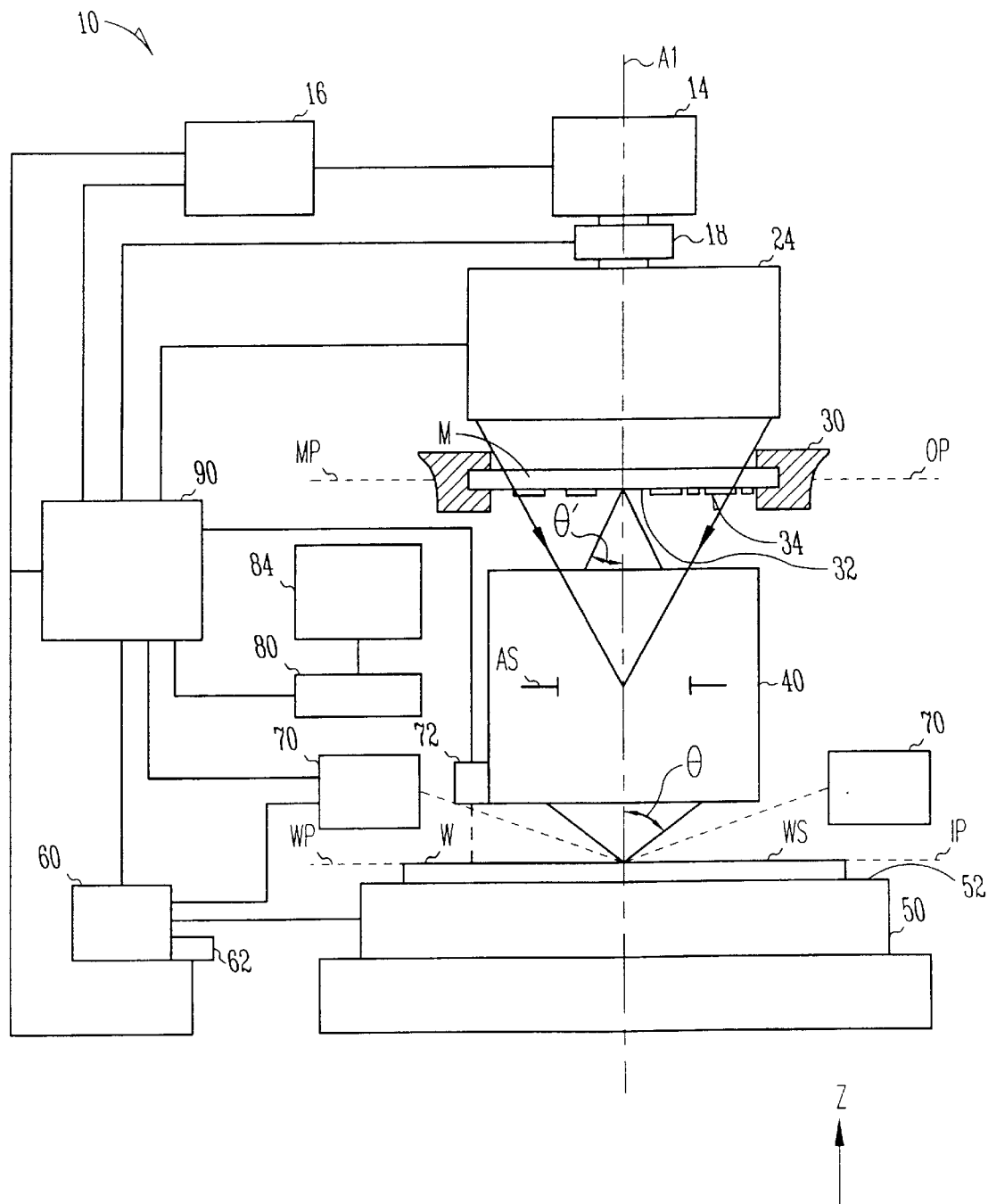
FIG. 1 is a schematic cross-sectional diagram of the cost-effective lithography system of the present invention.

With reference to FIG. 1, lithography system 10 of the present invention includes, in order along an optical axis A1, a radiation source 14 electrically connected to a radiation source controller 16. In the present invention, the term "radiation source" is used to generically describe a source for emitting radiation, which includes wavelengths ranging from the visible to the soft x-ray. Optionally included adjacent radiation source 14 is a pulse stabilization system 18 for providing pulse-to-pulse uniformity of the radiation pulses emitted from the radiation source in the case where the radiation source pulse-to-pulse stability needs to be improved.

Further included in system 10 along axis A1 is an illumination system 24, and a mask holder 30 capable of supporting a mask M at a mask plane MP. System 10 also includes a projection lens 40 having an object plane OP arranged substantially coincident with mask plane MP, an aperture stop AS and an image plane IP. A workpiece stage 50 is arranged adjacent projection lens 40 at or near image plane IP and has an upper surface 52 capable of supporting a workpiece W having an image-bearing surface WS. Electrically connected to workpiece stage 50 is a workpiece stage position control system 60, which includes a metrology device 62 for accurately measuring the workpiece stage position. Metrology device 62 is electrically connected directly to radiation source controller 16. A focus system 70 is arranged (e.g., adjacent projection lens 40, as shown) in operative communication with workpiece W and senses the position of image-bearing surface WS of the work piece with respect to projection lens 40. Focus system 70 generates electrical signals, which are sent to control system 60 and result in stage 50 adjusting the axial position of the workpiece.

System 10 further includes an alignment system 72 arranged in optical communication with workpiece W for aligning the workpiece with respect to a reference (e.g., the image of a mask alignment key imaged on the workpiece by projection lens 40). A workpiece handling system 80 in operable communication with workpiece stage 50 is provided for transporting workpieces between the workpiece stage and a workpiece storage unit 84. A system controller 90 is electronically connected to radiation source controller 16, pulse stabilization system 18, illumination system 24, workpiece stage position control system 60, focus system 70, alignment system 72, and workpiece handling system 80, and controls and coordinates the operation of these systems, as described in greater detail below.

The Radiation Source

Radiation source 14 is a key aspect of the present invention for the flash-on-the-fly mode of operation, as it enables the performance of rapid (i.e., 1 to 100 Hz), uniform, single-pulse exposures of the workpiece. To appreciate the type of radiation source 14 needed for use in lithographic system 10, the sources of illumination non-uniformities that can arise in the present invention are discussed.

There are two sources of illumination non-uniformities that impact the ability of lithography system 10 to successfully form images over image-bearing surface WS of workpiece W. The first, which is important in a flash-on-the-fly mode operation, is the pulse-to-pulse energy variations of the radiation source and the second, important no matter how many pulses are used for exposure, is the energy variation (i.e., spatial non-uniformity) over the exposure field for a given pulse.

In performing single-pulse exposures in lithography system 10 in the continuous lithography mode of operation, the pulse-to-pulse variation in exposure dose must be small enough that the critical dimensions of the features being printed are not affected by differences in exposure dose of the image-bearing surface of the workpiece. Variations in the size of critical dimensions between exposure fields can adversely affect device performance.

Accordingly, radiation source 14 is a pulsed radiation source, which may be a pulsed laser, a flash lamp source or other form of pulsed radiation generator, which when used in the continuous lithography mode of operation, is capable of generating pulses of radiation with little pulse-to-pulse variation. For most applications, including fabricating semiconductor integrated circuits with resolution-limited feature sizes, the exposure dose variation is ideally 1% (3σ) or less. On the other hand, for other applications such as printing non-critical IC layers and bonding pads, an exposure dose variation of 5% (3σ) or less might be quite acceptable. There are still other applications where illumination uniformity is less critical, such as in so-called "bump lithography" (i.e., the formation of solder bumps in forming integrated circuit board interconnections), where exposure dose variations as high as 10% (3σ) might be acceptable.

Illumination systems generally employ elements that serve to mix the incoming radiation from the radiation source to produce a uniform output. However, such mixing is only effective if the radiation being mixed is incoherent (or nearly so) and the intensities add linearly. In cases where the radiation is spectrally pure (i.e., coherent) over an extended path length, combining different portions of a beam can result in interference effects, which exacerbate the uniformity problem. In some cases, the mixed output can be cancelled completely by destructive interference in some portions of the field, resulting in a non-uniformity of ±100%.

Illumination non-uniformity, caused by coherence effects, can be reduced by increasing the number of spatial modes of the laser radiation source. The degree of illumination non-uniformity due to interference effects is approximately inversely proportional to the square root of the number of spatial laser modes, which is defined in the present invention as $m^4$. Thus, the relationship:

$$\text{Non-uniformity} \approx \pm (1/m^2) \quad (1)$$

The level of modulation due to coherence effects is approximated by the inverse square root of the number of modes, or $1/m^2$. To achieve an illumination non-uniformity of less than 1% (3σ), $m^2$ should be 30 or greater, and preferably 100 or greater. In terms of the number of $m^4$ spatial modes, $m^4$ preferably is 1000 or greater.

Pulsed radiation source 14 is preferably capable of emitting pulses of radiation having a temporal pulse length longer than about 1 nanosecond but shorter than about 1 millisecond, preferably shorter than 10 microseconds, and even more preferably, shorter than 1 microsecond. The energy per pulse for a single pulse exposure depends on the photosensitivity of workpiece image-bearing surface WS, the size of the projection lens image field IF, and the transmittance of the optical train (i.e., illumination system 24, mask M, and projection lens 40). The pulses of radiation can be emitted in bursts of two or more pulses in cases where multiple radiation pulses are used to form an exposure field. In an example embodiment, over a hundred pulses per burst may be used to achieve the desired exposure dose.

For many applications of lithographic system 10, workpiece W will be a semiconductor wafer with an image-bearing surface in the form of a photoresist layer. Most deep UV photoresists for photolithography need to be exposed with an amount of energy in the range from 5 mJ/cm² to 30 mJ/cm². Assuming 25% efficiency of the optical train, an image field size of 11 mm×11 mm, and a photoresist sensitivity of 25 mJ/cm², the required exposure energy from radiation source 14 is on the order of 120 mJ. At a 20 Hz repetition rate while in the continuous lithography mode of operation, this would require an average power output of 2.4W. These numbers are by way of example, and one skilled in the art will appreciate that they will vary according to the particular application. The repetition rate of the pulses is limited by the maximum power delivery capability of radiation source 14.

Generally, it is preferred that the output of radiation source 14 be such that workpiece image-bearing surface WS is exposed but not ablated. By way of example, assuming 30% of a single pulse, incident dose of 25 mJ/cm² is absorbed in a 1 micron thick photoresist layer serving as the image-bearing surface, the resulting temperature rise, neglecting losses due to conduction, is over 100° C. This is a manageable temperature rise for most deep UV photoresist systems. Given the various materials and conditions, each radiation pulse will have an expose dose in the rage between 1 and 500 mJ/cm².

As discussed in greater detail below, in lithographic system 10, workpiece stage 50 is used to move workpiece W during the exposures, as well as between exposures in either the continuous lithography mode or step-and-repeat mode of operation. In the continuous lithography, the temporal pulse length used and the pulse repetition rate may limit the maximum speed of workpiece stage 50. To avoid perceptible image smearing during the pulse-exposure, it is necessary that the motion of workpiece stage 50 during the pulse-exposure be small relative to the size of a minimum feature being printed.

It turns out that the amount of image smear that is tolerable is surprisingly large. For example, an image smear of 20% of the minimum feature size would be barely perceptible. If it is assumed that the lens field size has a width of 11 mm, the minimum feature size is 0.1 microns, and the laser exposure pulse has a temporal duration of 10 nanoseconds, then the maximum scan rate is 2 m/second and the corresponding laser pulse rate is 180 pulses/second. At the other end of the spectrum, a minimum feature size of 3 microns and an exposure pulse duration of 1 microsecond would require a maximum scan velocity of 600 mm/second and a pulse rate of 54 pulses per second. It has been observed that therefore the radiation source will have a temporal pulse duration that is less than the minimum feature size divided by the scan velocity.

A radiation source 14 suitable for use in lithographic system 10 of the present invention may need to be adapted from a commercially available radiation source. This is because most commercial laser-based manufacturing applications call for highly coherent lasers having only one or very few ($m^4$<10) spatial modes. The exception is excimer lasers, which typically oscillate in a sufficiently high number of modes to make them suitable for use in the present invention in that they are sufficiently incoherent. Also, excimer lasers operate at the desirable lithography wavelengths of 248 nm (KrF), 193 nm (ArF) or 157 nm ($F_2$). However, the typical lithography excimer laser, such as manufactured by Cymer Corporation, San Diego, Calif. and Lambda Physik of Goettingen, Germany, does not have very good pulse-to-pulse stability (e.g., only about 10% (3σ)). Systems using such lasers rely on pulse averaging to achieve an ultimate illumination uniformity of 1% (3σ). An excimer laser that may be suitable for use in the present invention for certain applications is available from TuiLaser AG, Munich, Germany, which as mentioned above manufactures deep UV excimer lasers having an advertised pulse-to-pulse stability of 2% (1σ). Improved pulse-to-pulse stability beyond the advertised characteristics may be obtainable by adapting the TuiLaser laser to suit the specific application of the present invention.

Solid-state lasers are also desirable as radiation source 14 of lithography system 10 of the present invention when used in the continuous lithography mode of operation. This is because they exhibit excellent pulse-to-pulse stability (generally, 1% (3σ) or less) and can be frequency-multiplied so that the output wavelength coincides with one of the excimer laser lithography wavelengths. However, most commercially available, solid-state lasers such as Nd:YAG and Alexandrite lasers are made to be highly coherent, which in the present invention would lead to the small-scale illumination non-uniformities discussed above.

Accordingly, for the purposes of the present invention, a solid-state laser can be used, but it needs to be designed to operate with a large number ($m^4$) of spatial modes, as discussed above, and be frequency multiplied to obtain deep UV wavelength operation. Although multi-mode solid-state lasers were actually the first type of laser developed, they are not generally commercially available because they have not found widespread application. Multi-mode solid-state lasers are not currently used in present-day lithography systems mainly because they have a spectral bandwidth that is larger than can be accommodated by conventional, all-refractive projection optical systems.

A multimode, solid-state, frequency-multiplied laser suitable for use as radiation source 14 was built for the inventors by Continuum, Inc., of Santa Clara, Calif., in the form of a frequency-doubled Nd:YAG laser outputting radiation of 532 nm wavelength with a 16 nanosecond (FWHM) temporal pulse length. To adapt this laser for lithography the output frequency would have to doubled a second time to yield an output wavelength of 266 nm. Other solid state lasers capable of serving as a suitable laser radiation source for the present invention, when modified to operate with a large number of spatial modes, include: a Nd:glass laser, an Alexandrite laser, and a Ti:Saphire laser lasing at wavelengths of 1047 nm to 1053 nm, 730 nm to 780 nm, and 700 nm to 900 nm, respectively. These lasers can be frequency doubled, tripled or quadrupled to operate in the deep UV (i.e., below 266 nm), where very sensitive photoresists are available. Possible wavelengths include quadrupled Nd:YAG at 266 nm, tripled Alexandrite or Ti:Saphire at 248 nm, and quadrupled Alexandrite or Ti:Saphire at 193 nm. Other wavelengths of a multi-mode, frequency-multiplied. YAG laser that can be used are 213 nm, 177 nm and 152 nm.

Another suitable radiation source is a Xenon plasma source operating at a wavelength in the 6 nm–14 nm wavelength region of the electromagnetic spectrum.

Still another suitable radiation source 14 for the present invention for certain applications (e.g., bump lithography) is a flash lamp containing a gas fill that emits radiation in the same part of the spectrum for which the projection lens is corrected. For example, a mercury filled flash lamp emits radiation in the near UV part of the spectrum (e.g., wavelengths between about 350 nm and about 450 nm), where many of the resists used for bump lithography are sensitive. In this case, the temporal pulse length from the lamp might be in the 10 to 100 microsecond range and the minimum feature formed by the optical system might be 25 to 50 microns wide. Assuming an allowable blur of 10 microns during a pulse length of 10 microseconds yields a maximum scan speed of 1 meter/second. Clearly, such a scan velocity would yield a very high throughput lithography system.

Radiation Source Controller

Radiation source 14 is electrically connected to radiation source controller 16, which serves to control the emission of radiation pulses from the radiation source. Radiation source controller 16 is in direct electrical communication with metrology device 62 and is also electrically connected to system controller 90. Control of the radiation pulses is necessary to ensure that the workpiece is irradiated only when the mask pattern imaged by the projection lens is aligned with the workpiece (e.g., aligned with a pre-existing exposure field, alignment mark), as described below.

Predicted location information for the exposure fields EF on image-bearing surface WS is obtained from alignment system 72 by way of system controller 90 and sent to radiation source controller 16 prior to irradiating workpiece W. Actual workpiece stage position information from metrology device 62 is sent continuously to radiation source controller 16. Radiation source controller 16 determines the correct time to initiate either a burst of pulses or a single pulse from radiation source 14. In the case of exposure with a single pulse of radiation in a continuous lithography mode of operation, three time delays must be taken into account. First, there is a time delay $\Delta T_1$ in the position information coming from metrology device 62, sometimes known as "data aging". Second, there is a delay $\Delta T_2$ between the time a signal is sent from radiation source controller 16 and the arrival of the mid-point of a radiation pulse at workpiece W. For example, if the pulse were 30 nanoseconds long, the mid-point would be 15 nanoseconds from either edge. Third, there is a time delay $\Delta T_3$ associated with computing and comparing the predicted and desired workpiece stage positions. All of these delays are readily measured or calculated, and are constant. Radiation source controller 16 must be able to initiate a signal to trigger a radiation pulse taking into account the various delays before a pulse is generated. The delay components, $\Delta T_1 + \Delta T_2 + \Delta T_3$, are multiplied by the scanning velocity to generate a position offset, which is applied to the desired position of the exposure fields EF. The corrected desired position is compared to the arriving position data coming from metrology device 62 to generate a trigger pulse when they are equal.

In an exemplary embodiment, radiation source controller 16 includes a Race++ VME bus computer system, available from Mercury Computer Systems, Inc. of Chelmsford, Mass. running VxWorks®, a real-time operating system from Wind River Systems, Inc. of Alameda, Calif.

Pulse Stabilization System

Pulse-to-pulse energy variations can arise in frequency-multiplied solid-state lasers and are exacerbated by the frequency multiplication process. Therefore, for either frequency-multiplied solid-state lasers or for most types of excimer lasers serving as radiation source 14, it may prove necessary to provide pulse stabilization system 18 in system 10 to improve the pulse-to-pulse uniformity of the radiation source to an acceptable level. This is particularly important in the continuous lithography mode, where a single pulse is used for each exposure.

Figure 2A:
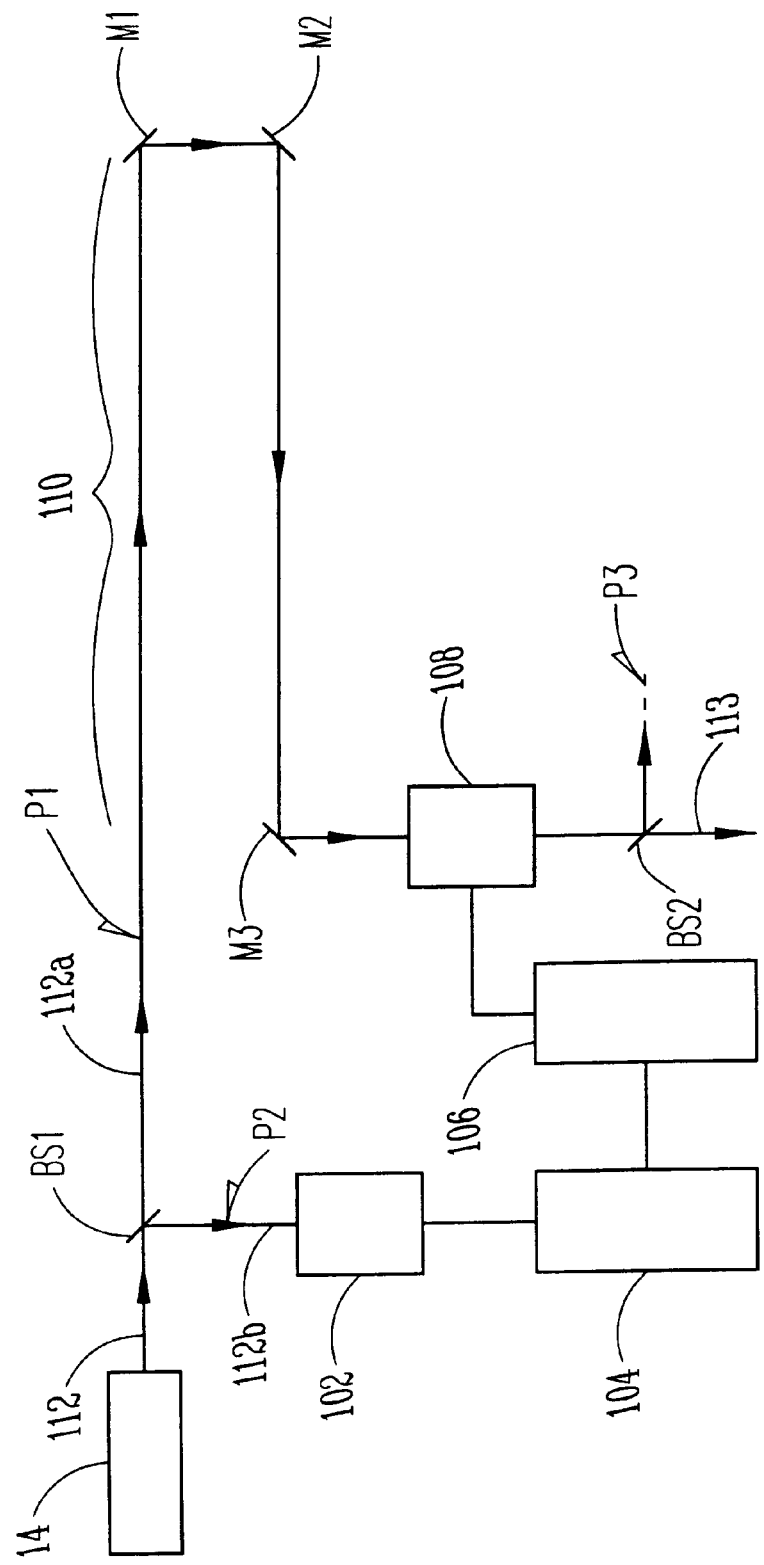
FIG. 2A is a schematic diagram of an example embodiment of a pulse stabilization system of the present invention suitable for use with the cost-effective lithography system of FIG. 1.

With reference to FIG. 2A, there is shown a first example embodiment of pulse stabilization system 18 of the present invention. System 18 includes, downstream from radiation source 14, a first beam splitter BS1 that forms first and second optical paths P1 and P2. A detector 102 is arranged along second optical path P2. Electrically connected to detector 102 is an integrator circuit 104, which is electrically connected to a Pockels cell driver system 106, which is electrically connected to a Pockels cell 108 arranged in first optical path P1. A Pockels cell and associated electronics suitable for the present invention is available as part number IPD2545 from Cleveland Crystals, Inc., Cleveland, Ohio. Optical path P1 includes a delay line 110, shown as being formed with an optical system comprising three mirrors M1–M3.

Figure 2B:
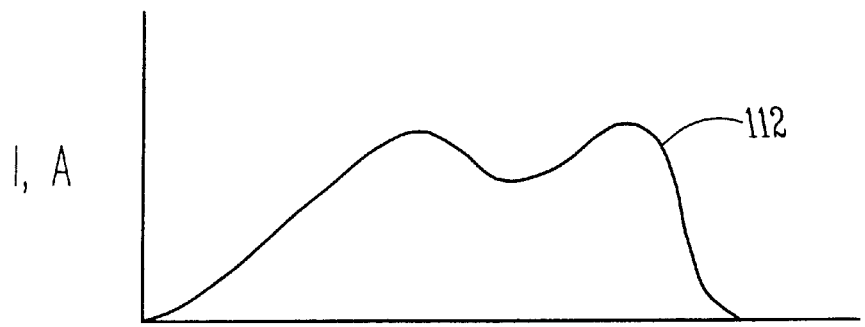
FIG. 2B is a plot of the intensity (I) profile vs. time of the radiation pulse from the radiation source of the present invention, which corresponds to the amplitude (A) profile vs. time of the detected signal from the detector in the pulse stabilization system of FIG. 2A.
Figure 2C:
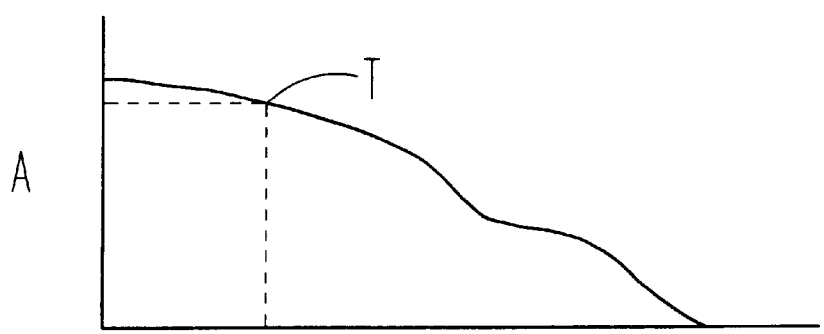
FIG. 2C is a plot of the integrated signal of FIG. 2B, showing the threshold energy value T.
Figure 2D:
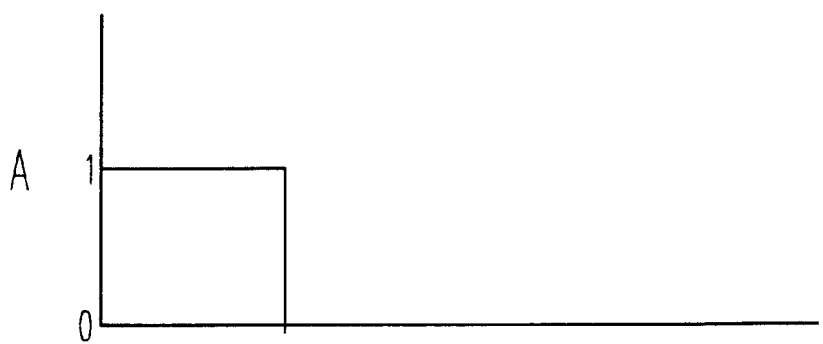
FIG. 2D is a plot of the threshold cut-off signal provided to the Pockels cell to activate the Pockels cell to truncate the radiation pulse passing therethrough.
Figure 2E:
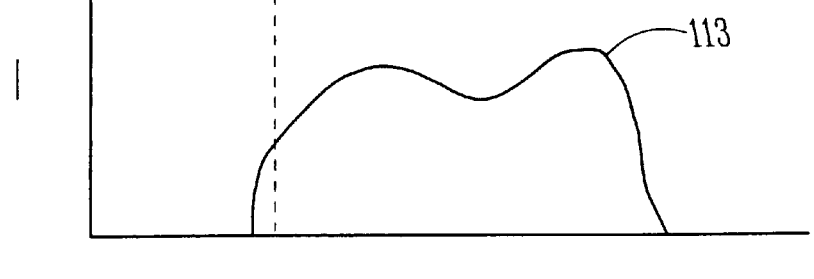
FIG. 2E is a plot of the truncated radiation pulse after having passed through and truncated by the Pockels cell.

With reference also to FIGS. 2B–2E, in operation, radiation source 14 emits a radiation pulse 112, which is split by beam splitter BS1 into a beam 112a traveling along first optical path P1 and a beam 112b traveling along second optical path P2. Radiation beam 112b need only be a small (but well-defined) portion of emitted radiation 112 (FIG. 2B). Detector 102 measures the instantaneous intensity of radiation beam 112b and produces a signal A proportional to the intensity I of the radiation beam (FIG. 2B). This signal passes to integrator circuit 104, which integrates the signal, thereby measuring the amount of energy provided by radiation beam 112b (FIG. 2C). The integrated signal is passed through to Pockels cell driver system 106. When a predetermined signal threshold T (corresponding to a predetermined energy threshold) is reached, system 106 sends an activation signal (FIG. 2D) that activates Pockels cell 108 so that it cuts off the transmission of radiation beam 112a traveling along optical path P1.

The net result is a truncated radiation pulse 113 (FIG. 2E) identical in shape to emitted radiation pulse 112 except for a missing portion of the pulse tail, which is truncated to substantially equalize all the output radiation pulses 112. In other words, radiation pulse 113 has an amount of energy corresponding substantially to the threshold value, which is a measure of the desired overall pulse energy. The lack of a sharp cut-off at the tail of radiation pulse 113 is due to the rise-time of the pockets cell, typically about 1 to 2 ns. In this example embodiment, pockets cell 108 acts only as an off/on switch, transmitting the entirety of each radiation pulse except for a portion of the tail.

Delay line 110 is an optical system (shown as comprising mirrors M1–M3) that delays radiation beam 112a from reaching Pockels cell 108 for the amount of time it takes radiation beam 112a to travel from beam-splitter BS1 to detector 102, for the detector to generate a corresponding electrical signal, for integrator circuit 104 to integrate the signal, and for Pockels cell driver system 106 to send a signal to Pockels cell 108. This delay is typically on the order on 10 ns, which corresponds to a delay line length of about 10 feet or so. Thus, the point at which Pockels cell 108 cuts off (truncates) radiation pulse 112a corresponds to the same point at which the integrated pulse intensity (i.e., energy) reached the predetermined threshold. This ensures that all the output pulses 113 have the same energy, or dose capability, provided that the threshold T is set below the integrated energy of the (anticipated) lowest pulse energy. The operation of Pockels cell 108 depends on having the input beam being linearly polarized and having a polarizer BS2 at the output, which passes the orthogonal polarization and dumps the identical polarization along optical path P3.

For some lasers, such as for example in the case of all excimer lasers, the laser output is not polarized. A polarized beam can be created by passing the output beam through a polarization-sensitive beam-splitter. If the unwanted polarization is dumped, then this scheme is less than 50% efficient. Accordingly, it would be advantageous to be able to combine both polarization beams created by the beam-splitter.

Figure 2F:
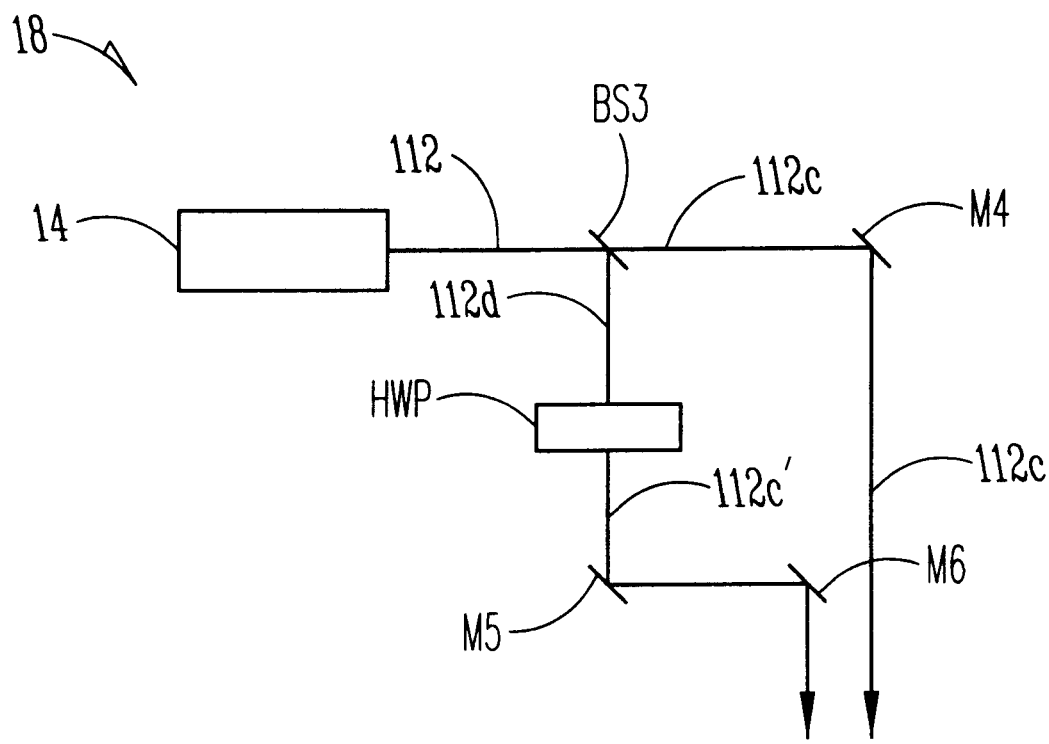
FIG. 2F is a schematic diagram of another exemplary embodiment of the pulse stabilization system of the present invention suitable for use with the rapid lithography system of FIG. 1, which combines beams of like polarization.

Thus, with reference to FIG. 2F, another example embodiment of pulse stabilization, system 18 involves separating radiation beam 112, via a beam splitter BS3, into two beams 112c and 112d having orthogonal polarizations. One of the polarizations (e.g., that of beam 112d) is converted to the other polarization by using a half wave plate HWP disposed in the optical path of beam 112d, thereby forming a beam 112c'. Beams 112c and 112d are then recombined using, for example, an optical system including fold mirrors M4–M6. Since the two beams 112c and 112c' now have the same polarization, they cannot be efficiently combined co-linearly, but can be combined by placing them side-by-side. In this case, beams 112c and 112c' are combined by reflecting one beam (e.g., beam 112c', as shown) from (knife-edge) mirror M6 and allowing the other to pass by the reflecting edge of the mirror. The combined output beam can then be directed to beam splitter BS1 in the pulse stabilization system shown in FIG. 2A and subsequently processed as described above in connection with FIG. 2A.

Figure 2G:
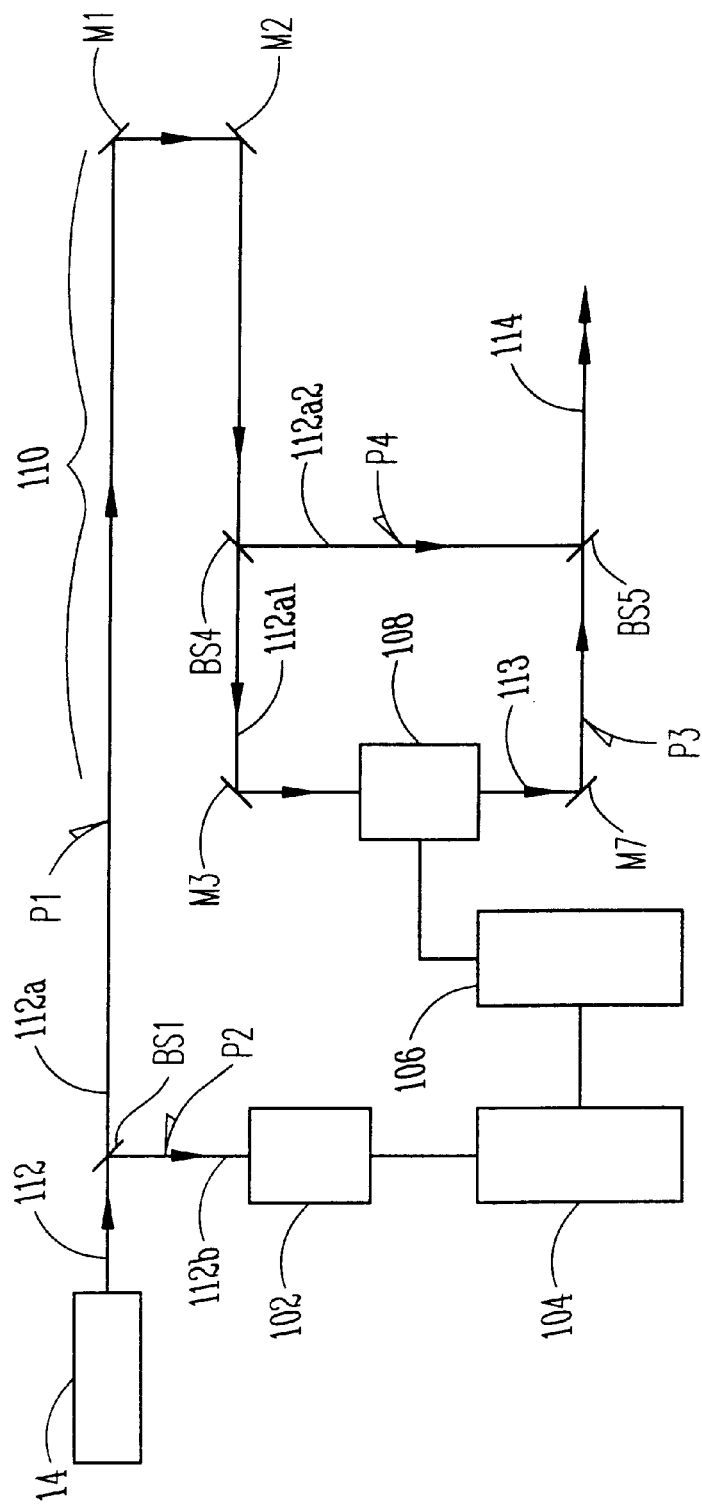
FIG. 2G is a schematic diagram of another exemplary embodiment of the pulse stabilization system of the present invention suitable for use with the rapid lithography system of FIG. 1, which provides for only a portion of the radiation pulse to pass through the Pockels cell.

With reference now to FIG. 2G, there is shown another example embodiment of pulse stabilization system 18 having a configuration that reduces the amount of energy in the radiation beam passing through Pockels cell 108. System 18 of FIG. 2G is essentially the same as that of FIG. 2A, except that it includes beam splitters BS4 and BS5 in optical path P1 and P3, respectively, and beam splitter BS2 is replaced by a fold mirror M7. Again it is assumed that radiation pulse 112 is polarized, or if not, has been made polarized. Radiation beam 112a returned from delay line 110 is split into two portions 112a1 and 112a2 by polarizing beam-splitter BS4. Radiation beam 112a2, which preferably represents the larger portion of radiation beam 112a, is reflected over an optical path P4 that bypasses Pockels cell 108. Radiation beam 112a1 passes through Pockels cell 108 and is attenuated as described above. Radiation beam 112a2 is totally reflected by polarization sensitive beam-splitter BS5 along optical path P3. Likewise, mirror M7 reflects output beam 113 along optical path P3, so that beams 112a2 and 113 are combined to form an output beam 114. The amount of light split-off by polarization sensitive beam-splitter BS4 is adjustable by simply rotating the beam-splitter about the optical axis passing through it.

Radiation beam 112a1 passing through Pockels cell 108 is attenuated by an amount just sufficient to equalize the energy content of all radiation pulses 112. In this case, Pockels cell 108 acts either as a switch, which allows only a portion of the beam to pass, or as a variable attenuator. Beam 112a1 passing through Pockels cell 108 is attenuated just enough so that when it is recombined with radiation beam 112a2 having a larger portion, the combined beam 114 is made up of radiation pulses having very consistent amounts of pulse energy. In this example embodiment, delay line 110 has to be sufficiently long so that either the attenuation of Pockels cell 108 can be set correctly before radiation beam 112a1 enters or the right proportion of beam 112a1 is trimmed off. An alternate possibility is to start with an unpolarized radiation pulse and extract a portion to be attenuated using a polarization sensitive beam-splitter. In such a case the polarized attenuated beam and the unpolarized beam would have to be recombined side-by-side using a knife-edge mirror, in the manner discussed above in connection with FIG. 2F.

With continuing reference to FIG. 2G, by way of example of the operation of the pulse stabilization system shown therein, radiation source 14 is measured to have a maximum pulse-to pulse dose (energy) variation between 90 mJ and 110 mJ. A pulse with a dose of XmJ is measured as it exits radiation source 14, and the attenuation (A) to be set in the Pockels cell is calculated as follows:

$$A=(90-0.8X)/0.2X \qquad (2)$$

A radiation pulse 112a is passed through delay line 110 such that 80% of the intensity of radiation pulse 112a is routed directly to the output along optical path P3 as radiation pulse 112a2, while 20% of the pulse (radiation pulse 112a1) is attenuated by the factor A by Pockels cell 108 to form radiation pulse 113 before being combined with pulse 112a2. The intensity ($I_o$) of the resulting output pulse 114 equals:

$$I_o = 0.8X + 0.2X(90 - 0.8X)/0.2X = 90 \text{ mJ} \tag{3}$$

Thus the output pulse energy is always equal at 90 mJ for any input between 90 mJ and 110 mJ.

Figure 2H:
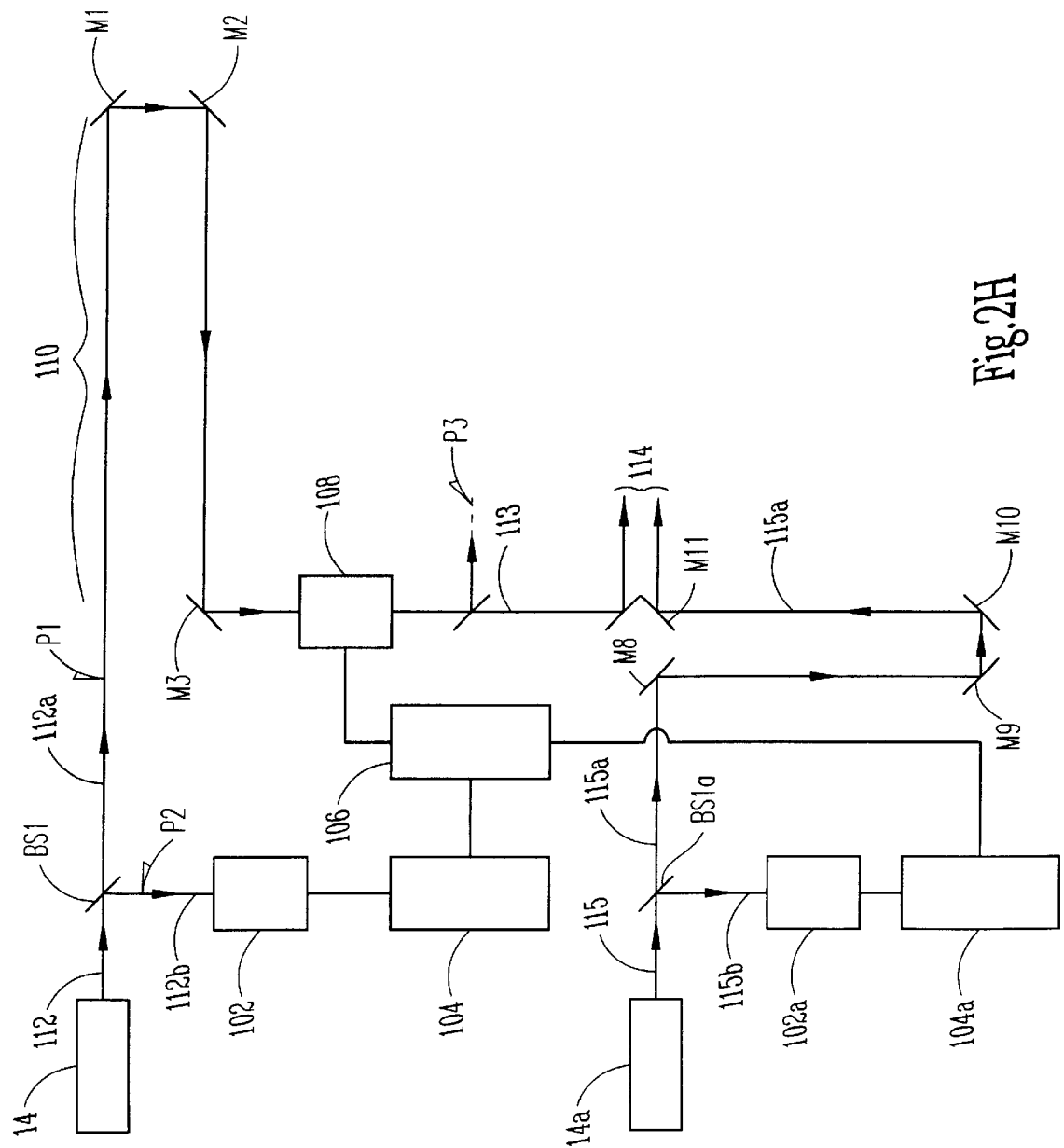
FIG. 2H is a schematic diagram of another exemplary embodiment of the pulse stabilization system of the present invention suitable for use with the rapid lithography system of FIG. 1, which incorporates two radiation sources.

With reference now to FIG. 2H, in another preferred embodiment of pulse stabilization system 18, instead of dividing the input radiation pulse into two portions, one of which is attenuated to generate a constant output pulse, it is also possible to employ two radiation sources, which are activated simultaneously, or nearly so. System 18 of FIG. 2H includes the system of FIG. 2A, to which is added a second radiation source 14a, which in a preferred embodiment is capable of providing a larger output radiation pulse 115 that is larger than radiation pulse 112 from radiation source 14. Associated with laser source 14a are a beam-splitter BS1a, which forms radiation beams 115a and 115b, detector 102a electrically connected to an integrator circuit 104a, which is electrically connected to Pockels cell driver system 106 in the manner discussed above in connection with FIG. 2A. Thus, system 106 receives the integrated power measurements from both radiation sources. Fold mirrors M8–M10 serve as an exemplary optical system to fold the optical path so that beams 115a and 113 can be combined using a common fold corner mirror M11.

Thus, in operation, one radiation source (14a) supplies the bulk of the pulse power and the other (14) the extra power required to make all the pulses have an energy equal to or greater than the largest pulse from the biggest laser. If the integrated dose from radiation source 14 is S and from 15 is B, the threshold T is set larger than the maximum pulse height from radiation source 14a, laser and the attenuation (A) to be applied to the radiation pulse from radiation source 14 is given by:

$$A = (T-B)/S \tag{4}$$

After combining unattenuated radiation pulse 115a from radiation source 14a with the radiation pulse 113 from radiation source 14 attenuated via truncation by the factor A, the intensity ($I_o$) of output pulse 114 equals:

$$I_o = B + S(T-B)/S = T \tag{5}$$

Therefore the output always equals the threshold setting T.

Another aspect of this invention is that pulse trimming can be applied at the fundamental frequency, or at a low-frequency multiple of the final frequency, and then the final frequency conversion can be performed on the trimmed pulse. The advantage of this aspect of the invention is that it may be easier to obtain the components for system 18 and also be more efficient to perform pulse-stabilization at lower frequencies, i.e., it may be easier to obtain and more efficient to operate the Pockels cell at 772 nm or 386 nm rather than, say, at 193 nm.

Illuminator System

With reference again to FIG. 1, system 10 further includes, adjacent radiation source 14 along axis A1, illumination system (or "illuminator") 24 is arranged to receive radiation from radiation source 14.

As mentioned above, the second source of illumination non-uniformity in the lithography system of the present invention is the spatial variation in energy over the exposure field for each exposure pulse. Thus, even if pulse-to-pulse energy variations are entirely eliminated, each radiation pulse must be spread evenly and uniformly over the mask.

Accordingly, illuminator 24 is adapted to provide uniform illumination to downstream mask plane MP. Mask plane MP is defined by mask holder 30, which is adapted to support planar mask M having a downstream surface 32 upon which a pattern 34 is formed. Pattern 32 may be binary (e.g., a chrome pattern on clear glass), or a phase mask (e.g., phase changes generated by a patterned phase-inducing dielectric material), or a combination of the two. Pattern 34 typically has minimum features which, if repeated to produce the finest possible pattern of opaque and clear lines would define a maximum modulation frequency referred to herein as the maximum "mask modulation" frequency. The image of the mask then has an associated maximum image modulation frequency. Both the mask and mask image modulation frequency refer to the maximum modulation frequencies corresponding to minimum-size features making up pattern 34 and the mask image, respectively. In most applications the repetition rate, the scan speed and the temporal pulse length are selected such that each mask image forming each exposure field is blurred by an amount that reduces the amplitude of the maximum mask image modulation frequency by 34.6% or less.

Mask M is typically quartz or other suitable material transparent to the wavelength of radiation from radiation source 14, except where the mask is a reflective mask and the substrate material transmittance is of no consequence. In the case where system 10 employs EUV radiation, mask M is reflective. A binary reflective mask is created by coating the reflective layer with a patterned absorber layer. In an exemplary embodiment of the present invention, mask M is one whose cost is amortized over the processing of 3000 workpieces or less. This aspect of mask M takes into account the cost-of-ownership of system 10 and makes for cost-effective patterning of the workpiece for a variety of applications, including the manufacturing of semiconductor devices.

The amount of information on a mask depends on the minimum feature size and the extent of the patterned area. Since the information from the mask is identical to that transferred to the workpiece (e.g., wafer), it is permissible to consider the information contained in a single printed field on the wafer. This is simply the (exposure) field area divided by the square of the distance that indicates how accurately a minimum feature can be located. Generally this distance is between one fifth and one tenth the minimum feature size. Thus, assuming a factor of 10, the information per field (I) is given by:

$$I = (\text{Field area})/((\text{Minimum feature size})/10)^2 \tag{6a}$$

or $$I = 100(\text{Field area})/(\text{minimum feature size})^2 \tag{6b}$$

The information content of a field is important since it determines how long it takes to write and inspect a mask, as well as how many defects are likely to found, which need to be repaired. Using a field size that is less than half that of a conventional system reduces, in proportion to the size reduction, the mask write time, inspection time and the number of mask defects needing repair. Since mask costs are dominated by the costs of writing, inspection and repair, the cost of the mask is substantially reduced for a lithography system having a projection lens with a smaller-than conventional image field size. For example, an advanced reticle for covering a 22 mm by 22 mm field size might cost as much as $50,000. Assuming there is a $4000 fixed cost for a reticle independent of the field size, then a similar reticle for covering only an 11 mm by 11 m field size would cost about $15,500. Thus, the reticle associated with the smaller image field having half the width of the conventional field costs only 31% of the reticle associated with the larger image field.

A further advantage of covering a small field size is that the demagnification ratio between the reticle and the workpiece can be made larger. For example, the size of the substrates used for reticles has generally been standardized at 6"×6". This sets the maximum demagnification for a step-and-scan system having a 33 mm by 26 mm field size at 4 and the demagnification for a 22 mm by 22 mm step-and-repeat system at 5. However the demagnification for an 11 mm by 11 mm field size could be 6 or even as high as 11. Higher demagnification ratios make it easier to write the reticle and therefore further reduce the reticle cost. The demagnification ratio does not affect the amount of information on the reticle.

Figure 3:
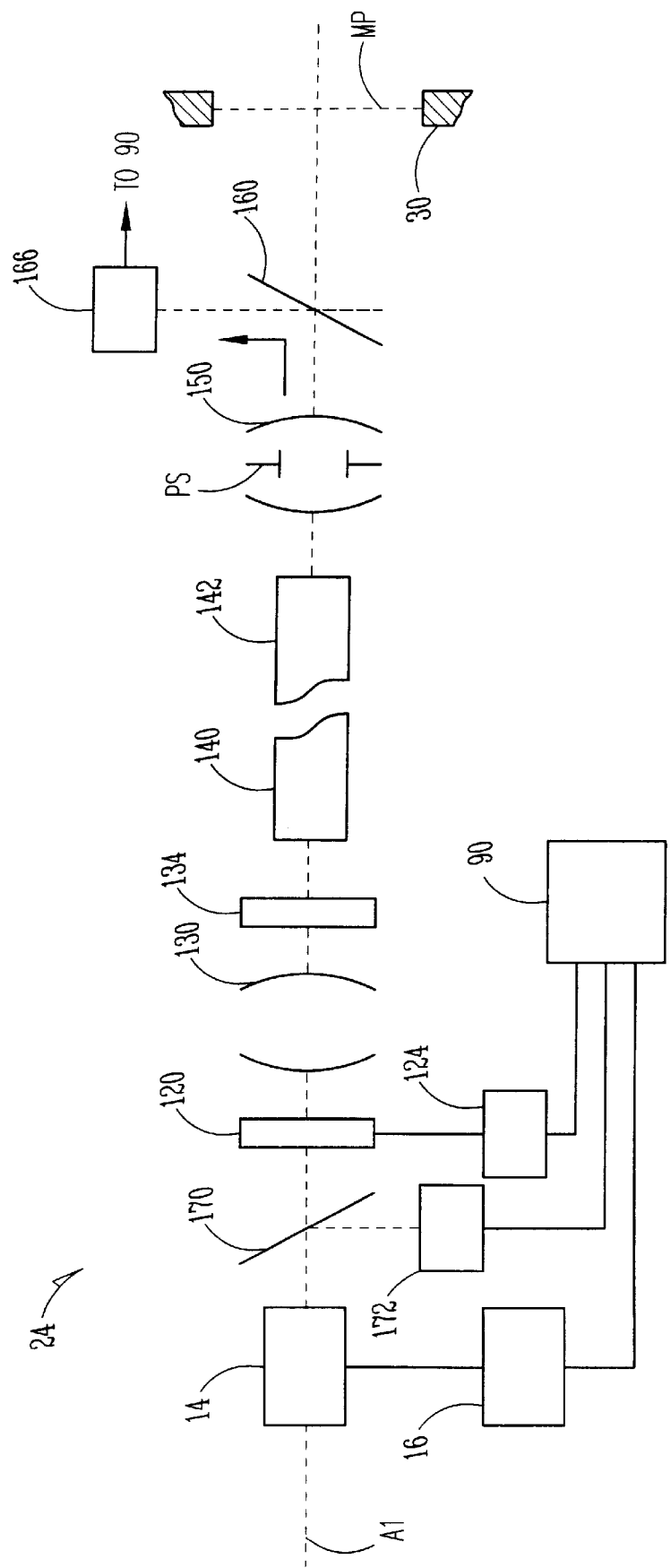
FIG. 3 is a schematic cross-sectional diagram of an exemplary illumination system suitable for use with the cost-effective lithography system of the present invention.

With reference now to FIG. 3, an exemplary illumination system 24 includes, in order along axis A1 from radiation source 14, a variable attenuator element 120 for attenuating the pulsed radiation emanating from the radiation source. Variable attenuator element 120 is operatively connected to an attenuator control unit 124, which controls the amount of attenuation of the pulsed radiation. Attenuator control unit 124 is also electronically connected to controller 90, which controls the attenuator control unit via an electronic signal. Variable attenuator element 120 may be, for example in the case of an ultraviolet radiation source 14, a dielectric-coated mirror having a transmission that varies with incidence angle, and which may be driven by a motor controller (not shown) capable of rotating the dielectric mirror to achieve a desired angle and attenuation.

Illumination system 24 further includes a first beam transfer optical system 130, a diffuser 134, and an optical integrator 140 having an output end 142. Diffuser 134 may be ground glass or other type of element that disperses radiation incident thereon. Optical integrator 140 is arranged to receive the dispersed radiation exiting the diffuser and may be a fly's eye lens comprising a plurality of lenslets that break up the laser radiation incident thereon into a plurality of segments that are recombined in a manner that improves uniformity. Optical integrator 140 may also be a radiation tunnel, i.e., a solid glass rod having a polygonal cross section and walls that reflect radiation traveling therethrough via total internal reflection, or a hollow rod having a polygonal cross section and reflective walls designed to reflect radiation traveling therethrough. The number of reflections ("bounces") of the radiation within the radiation tunnel determines the degree of uniformization.

With continuing reference to FIG. 3, illumination system 24 further includes a second beam transfer optical system 150 arranged adjacent optical integrator 140. Beam transfer optical system 150 has a pupil stop PS conjugate to projection lens aperture stop AS, and an numerical aperture designed to capture uniformized radiation emanating from optical integrator 140. Beam transfer system 150 images end 142 of optical integrator 140 onto mask plane MP to provide uniform illumination, and it images the pupil stop PS onto the entrance pupil of the projection system.

As discussed above, the illumination uniformity over an exposure field for a given radiation pulse (i.e., the "spatial uniformity per-pulse") will, for many applications, also need to be within 1% (3σ). However, the precise value for the spatial uniformity per pulse depends on the particular application process window, which is defined by a variety of factors. For semiconductor fabrication, these factors include projection lens aberrations, mask linewidth variations, photoresist sensitivity, coating uniformity, wafer flatness, and the like, since all of these cause line-width variations. As mentioned above, it may be, for example, that for some applications, a 1% (3σ) variation in per-pulse illumination is tolerable, while for others, a 5% (3σ) variation is acceptable, while for still others (e.g., bump lithography), up to 10% (3σ) variation is tolerable.

With continuing reference to FIG. 3, in an example embodiment, a partially reflecting fold mirror 160 is arranged downstream of second beam transfer optical system 150. A detector 166 is arranged adjacent fold mirror 160 so as to detect radiation incident the mask. In addition, a second fold mirror 170 and a detector 172 are provided immediately adjacent radiation source 14. Detectors 166 and 172 are electrically connected to system controller 90, which is adapted to receive electrical signals from the detectors and perform beam diagnostics, including analyzing the illumination uniformity, transmission changes in most of the illuminator optical path and pulse-to-pulse variations in the output from radiation source 14.

Exemplary Small-field Projection Lens

Figure 4:
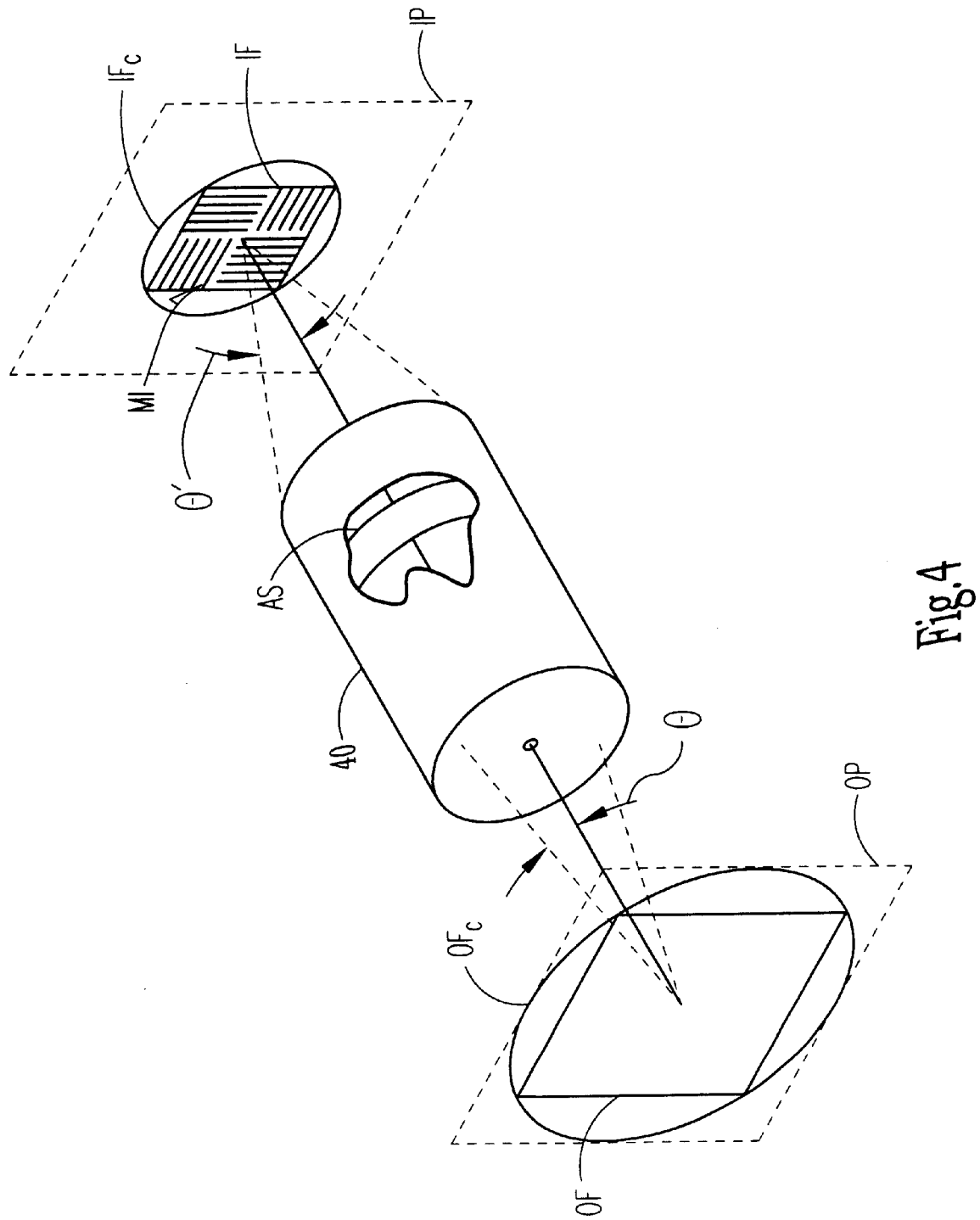
FIG. 4 is a schematic perspective diagram of a projection lens showing the image plane and its associated lens field, the object plane and its associated object field, and the angles associated with the object-side and image-side numerical apertures.

FIG. 4 illustrates in greater detail projection lens 40, which includes an object plane OP containing an object field OF, and an image plane IP containing an image field IF in which the mask image MI is formed. Projection lens 40 also includes an aperture stop AS. Object field OF and image field IF are actually formed from circular object and image fields $OF_C$ and $IF_C$. For example, a square image field IF of 11 mm×11 mm can be comfortably formed from a circular image field $IF_C$ of 16.0 mm in diameter. The image of mask M (the "mask image") is formed within the image field.

Figure 5:
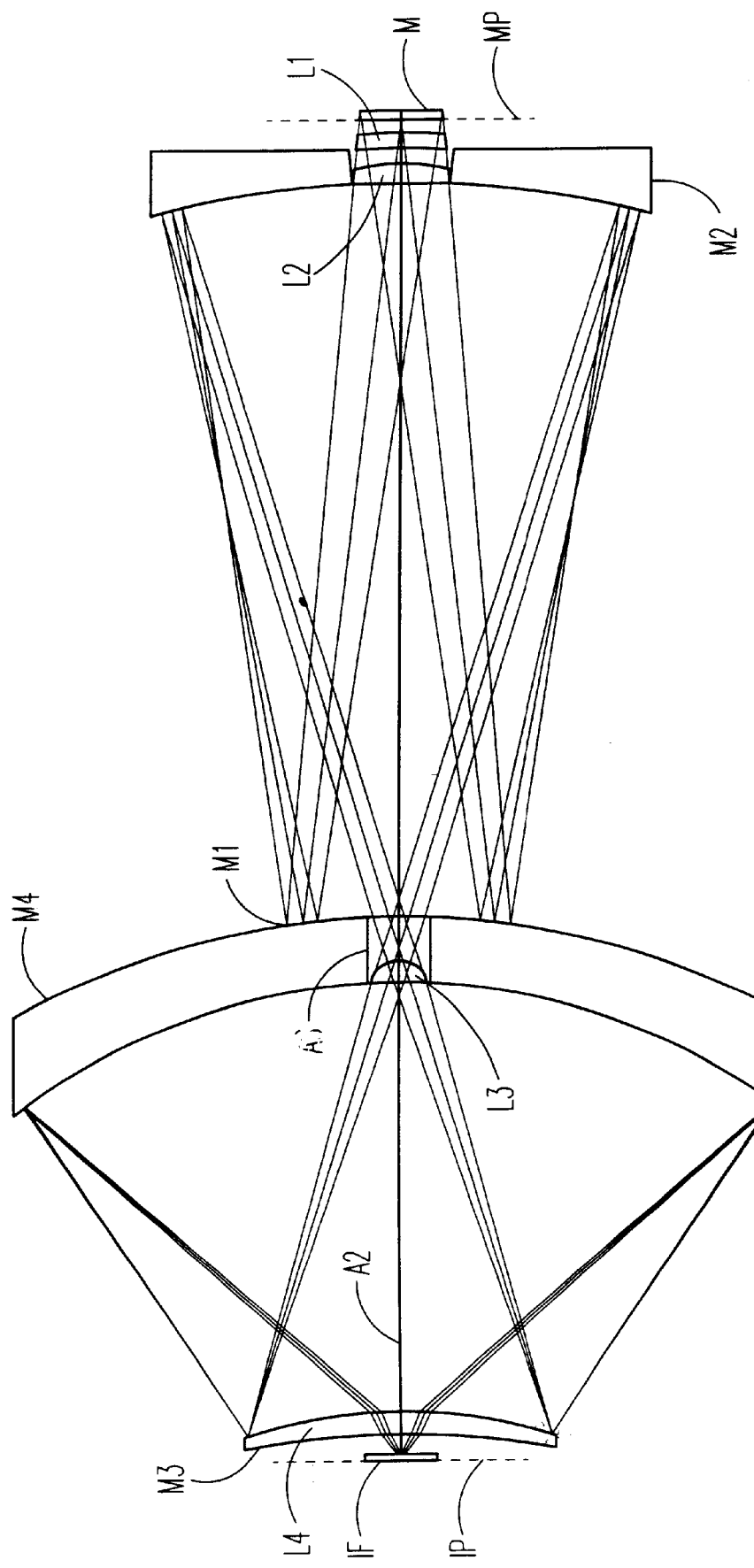
FIG. 5 is a cross-sectional lens diagram (shown 0.227 times actual size) of an exemplary projection lens having a catadioptric design, 6× reduction magnification, an image-side NA of 0.75, an operating wavelength of either 248 nm, 193 nm or 157 nm, and an image field size of 11 mm×11 mm.

With reference now to FIG. 5, there is shown an optical diagram of an exemplary lithographic projection lens 40 suitable for use in lithographic system 10 of the present invention. Projection lens 40 of FIG. 5 is an on-axis catadioptric design with a reduction factor of 6×, an image-side NA of 0.75, and an image field IF of 11 mm×11 mm. Use of such a projection lens is unconventional in modern-day lithography, but becomes a practical alternative to larger-field, smaller reduction-factor lenses through the teaching of the present invention and at the wavelengths currently used in leading-edge lithography. Another example of a suitable lithographic projection lens 40 is a Wynne-Dyson lens design having a unity reduction ratio.

Small-field projection lenses such as lens 40 of FIG. 5 may also be used cost-effectively without using the "continuous lithography" operational mode in special situations (e.g., certain foundry applications with limited wafers-per-mask) where the cost-of-ownership calculation proves more favorable than lithography systems with larger field sizes. Here, "small lens field" generally refers to a lens field having an area of 2 $cm^2$ or less. The "continuous lithography" technology of the present invention has the advantage that it makes a favorable cost-of-ownership calculation for a small-field lithography system attractive in any situation, so that use of small-field lithography systems can become universal.

Thus, in a preferred embodiment of the present invention, projection lenses having lens field sizes that are substantially smaller than that of conventional lithography systems are used either in the conventional step-and-repeat mode or the flash-on-the-fly modes. The use of smaller projection lens fields allows for the use of masks (reticles) having substantially less information than those used with conventional, larger-lens-field systems. A smaller lithographic lens saves a considerable amount of money in the initial price of the lithography system. The savings on the smaller reticle field depends on the number of substrates to be exposed using the reticle, but the savings are appreciable on jobs involving fewer than 3000 substrates per reticle set. Although the smaller lens field size also leads to a lower throughput, the savings in the cost of the lens and on reticles more than offsets this disadvantage.

By using the "continuous lithography" exposure mode, it is possible to achieve exposures using single pulses of radiation and eliminate the throughput disadvantage associated with small lens fields. Use of a smaller-than-conventional lens field size facilitates single pulse exposures because the total amount of energy required per pulse is proportional to the exposure area. Thus, a smaller lens field size requires a smaller and therefore less expensive laser.

Further, the useful life of a large-field lens may be limited by the high energy contained in each radiation pulse. High-energy pulses of deep UV radiation tend to compact glass over an extended period of time and eventually lead to unacceptable wavefront errors in the lens. A smaller lens field size opens up the number of design possibilities to include designs having fewer refractive lens components and more reflective lens elements. Since it is the refractive lens elements that have limited life, a design having fewer refractive elements can generally be expected to have a longer useful life. This makes for a lithography system that allows for the cost-effective use of smaller-than-usual lens (image) fields, which translates into less expensive projection lenses, and more generally, less expensive manufacturing of devices, such as semiconductor integrated circuits and the like.

The projection lens 40 of FIG. 5 includes, along a optical axis A2 in order from mask plane MP along the optical path, first and second lens elements L1 and L2, a negative mirror M1, a first concave mirror M2, a third lens element L3 arranged at or near aperture stop AS, a convex Mangin mirror M3, a second concave mirror M4, and a fourth lens L4. Lens L4 constitutes just the refractive portion of Mangin mirror M3, which does not have a reflective coating in the central region through which the image emerges. Also shown are image plane IP and image field IF.

Lens elements L1–L4 are made of calcium fluoride for systems operating below 190 nm and of either fused silica or calcium fluoride for longer wavelength systems. Mirrors M1–M4 are aspheric and include coatings to enhance reflectivity. Because almost all of the optical power in the design of projection lens 40 is contained in the four mirrors M1–M4, with the few weak lens elements acting primarily as aberration correctors, the system is easily adapted to operate at any wavelength that is transmitted by the refractive components. Furthermore, the spectral bandwidth surrounding the design wavelength is many times wider than required to transmit the spectral range generated by an un-narrowed excimer laser or a frequency multiplied, multimode, solid-state laser. In an exemplary embodiment of the projection lens 40 of FIG. 5, the spectral bandwidth is 1 Angstrom or greater. In another exemplary embodiment, the NA is 0.7 or greater.

To compete with current state-of-the-art projection systems, projection lens 40 is preferably optimized to operate at either 193 nm or 157 nm, the wavelengths corresponding to the excimer wavelengths of ArF and $F_2$, respectively. With a numerical aperture of 0.75, the resolution at 193 nm would range from 154 nm to 77 nm and at 157 nm it would range from 126 nm to 63 nm. It is worth noting that from a cost-of-ownership viewpoint, the higher the resolution of the projection lens, the more complicated and expensive the mask becomes.

Workpiece and Workpiece Stage

With reference again to FIG. 1, system 10 further includes workpiece stage 50 with upper surface 52 capable of supporting workpiece W to be processed. In a preferred embodiment of the present invention, workpiece W is a semiconductor wafer, and image-bearing surface WS is a layer of photoresist.

Figure 6:
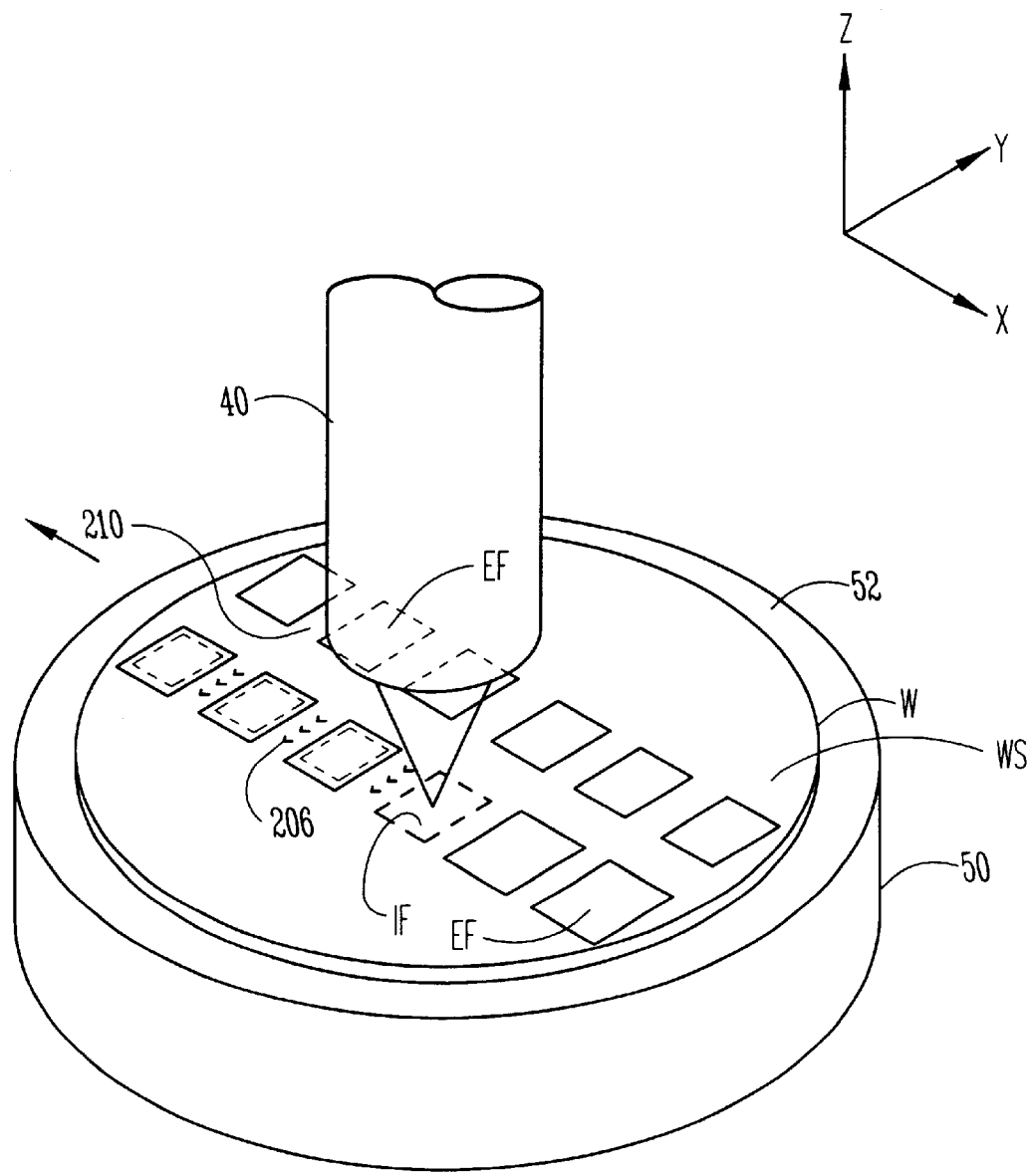
FIG. 6 is a perspective close-up view of the projection lens and workpiece stage of the system of FIG. 1, showing a workpiece resident on the workpiece stage, and showing pre-existing and future exposure fields along with the lens field of the projection lens, with the stage motion indicated by an arrow.

Workpiece W is arranged relative to projection lens 40 such that an image (i.e., mask image MI; (FIG. 4) is formed on the workpiece over an exposure field EF (see FIG. 6) formed within image-bearing surface WS. In the present invention, exposure field EF is contained within the lens image field IF. This is because image field IF is actually circular (FIG. 4), whereas the exposure field is rectangular. Image-bearing surface WS may overlay patterns in the substrate formed from previous exposures of the workpiece using other masks M. Usually, it is necessary to superimpose successive patterns to high accuracy, i.e., to a small fraction of the minimum feature size. Where no previous exposure fields EF exist on workpiece W, the exposure fields must be laid down in a precisely predictable manner so that subsequent exposures can be accurately aligned therewith without having to map the location of each exposure field.

Referring again to FIG. 1, workpiece stage 50 is electronically connected to a stage position control system 60, which is capable of positioning workpiece W with high precision relative to projection lens 40 or to a related reference, such as image field IF. Wafer stage 50 preferably has movement capability in all 6 degrees of freedom, as schematically represented and as currently available in the lithography art. The ability to move in the X- and Y-planes and rotate about the Z-axis is necessary for properly positioning mask images MI on image-bearing surface WS of workpiece W. Z-axis movement capability, along with angular adjustment capability about the X- and Y-axis (pitch and roll), is necessary for keeping the workpiece surface within the shallow depth of focus of projection lens 40. The Z-position of the image-bearing surface WS (which is also the focal surface) of workpiece W can vary between exposure fields EF if the workpiece is not perfectly flat. Similarly, small rotations about the X- and Y-axis can also occur. Accordingly, metrology device 62, which in an example embodiment is an interferometer, is preferably included as part of stage position control system 60 for accurately measuring the coordinates of workpiece stage 50 relative to projection lens 40, and for providing this positioning information to radiation source control system 16, as discussed above.

Figure 7:
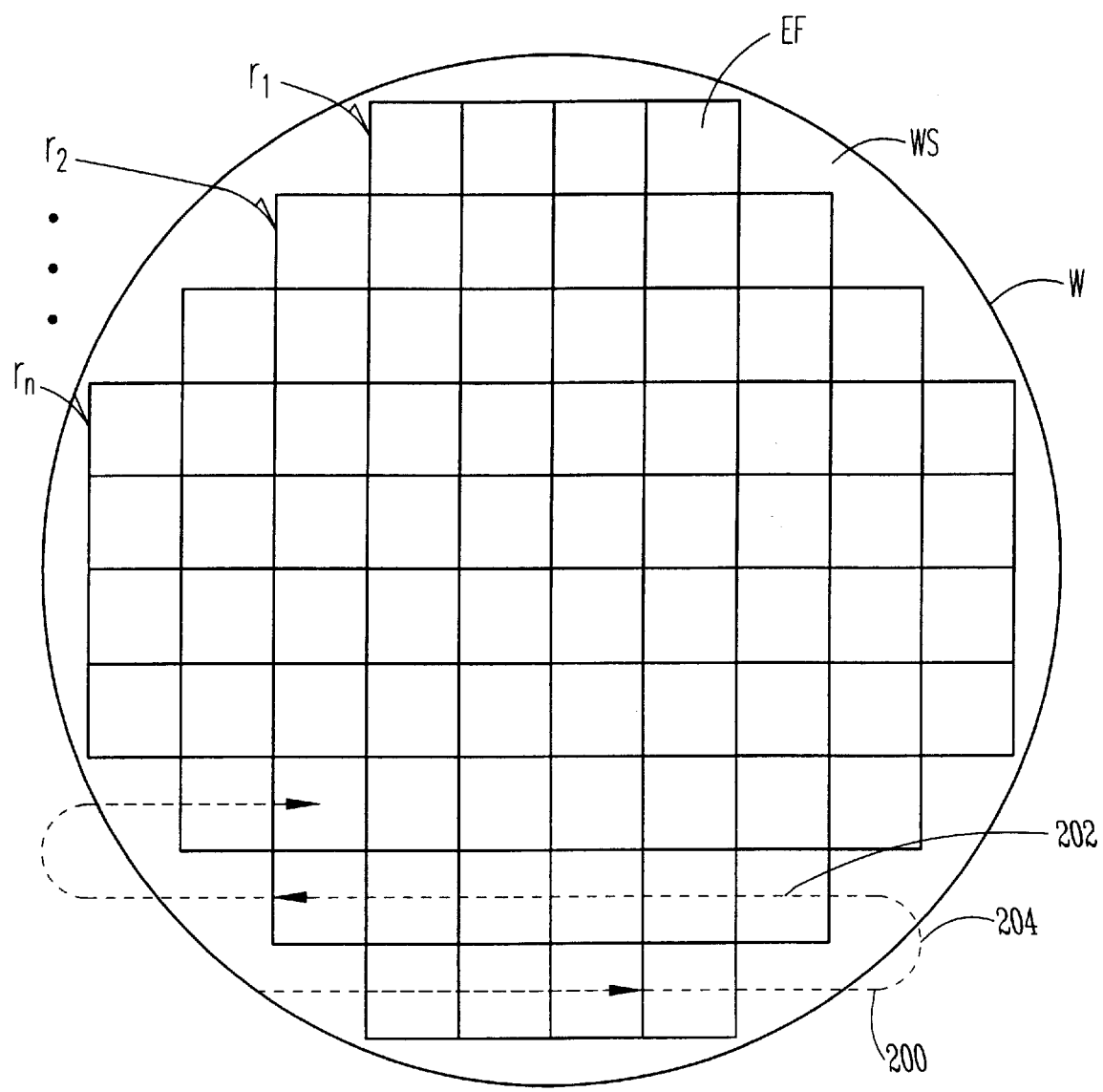
FIG. 7 is a plan view of a workpiece showing the exposure fields and a scan path representing the movement of the workpiece stage for forming the exposure fields.

FIG. 7 shows an exemplary scan path 200 utilized by a flash-on-the-fly mode of operation over a semiconductor wafer as workpiece W for forming a plurality of exposure fields EF on workpiece surface WS. Scan path 200 includes a number of linear portions 202 over the rows r1, r2, . . . $r_n$ of the exposure fields EF, with turns 204 at the end of each row. The movements of workpiece stage 50 necessary for practicing the present invention differ significantly from what has previously been done with scanning (i.e., step-and-scan) lithography systems. Workpiece W is preferably scanned at a substantial velocity across an entire row or column of exposure fields EF while each exposure field EF in the particular column or row is exposed with a single, short radiation pulse. The scan velocity for many applications is preferably between 50 mm/s and 500 mm/s, while for other applications higher stage speeds (e.g., 2000 mm/s) can be used, with the upper limit being defined by the ultimate scan velocity capability of the stage (e.g., 2000 mm/s for present-day stages) and the brevity of the radiation pulse. Existing air-bearing and magnetic levitation ("maglev") workpiece stages and stage position control systems are capable of providing such scan speeds and are thus suitable for use with the present invention. Exemplary workpiece stages 50 are described in U.S. Pat. No. 5,699,621, and in the article by M. E. Williams, P. Faill, S. P. Tracy, P. Bischoff, and J. Wronosky, entitled Magnetic levitation scanning stages for extreme ultraviolet lithography, ASPE 14$^{th}$ annual meeting, Monterey Calif., November 1999, which patent and article are incorporated herein by reference. In various applications, as faster stages are developed, a stage with the capability of moving the workpiece at a velocity of up to 5000 mm/s could be employed.

A number of factors determine the maximum practical scan speed. In order to transition to a uniform velocity over linear portion 202 of scan path 200 without undue vibration, workpiece stages are obliged to follow a trajectory that ramps the acceleration/deceleration from zero to maximum and back to zero. This means the workpiece stage hits the maximum acceleration only briefly and the maximum acceleration is usually limited to about 1 g to 2 g. Since the maximum acceleration is limited, the higher the scan speed, the longer it takes to accelerate and decelerate the workpiece stage. A higher scan velocity saves time during scanning but the length of the path over which uniform velocity is required is limited by the size of the workpiece, e.g., to 300 mm if the largest available workpiece is a 300 mm wafer. Thus, there is a scan velocity for optimum throughput, which depends on the maximum acceleration and the scan length. For a typical case and a maximum 2 g acceleration, this optimum scan velocity is about 1250 mm/second.

Economics can also limit the maximum scan speed. Higher scan speeds require higher pulse repetition rates and higher radiation source power levels, which increase the cost of the radiation source. At some point, it becomes more cost-effective to limit the radiation source cost than to further increase the throughput of the exposure tool. The same is true with the workpiece stage in that, from an economic viewpoint, it may be advantageous to provide a workpiece stage that scans at a lower speed (e.g., 500 mm/s) but which is more affordable. Stated in other terms, throughput, which is a function of the workpiece stage velocity and radiation source power, may preferably be limited by cost-of-ownership economics rather than by workpiece stage or radiation source technology limits. For the possible various types of materials and other conditions, the radiation source could be required to provide radiation pulses at a repetition rate of between 1 and 500 Hz.

In a preferred embodiment of the present invention, workpiece stage 50 is scanned during exposure of workpiece W in the continuous lithography mode of operation. This scanning is preferably done at constant velocity over linear portion 202 of scan path 200 (FIG. 7), though varying velocity, which is encountered during stage acceleration and deceleration, can be accommodated. During the scanning, motion in the orthogonal (i.e., Y) direction is very small and is used to accommodate any residual error in rectilinearity of the exposure fields EF determined by alignment system 72. While small, these orthogonal motions must be completed between exposure pulses. Generally, these small corrections can be handled by introducing small perturbations in the workpiece stage trajectory, but they could also be accommodated with a piezoelectric-driven stage that rides on the main X, Y workpiece scanning stage 50. These small-motion corrections could also be accomplished with a piezoelectric driven reticle stage. Larger motions in the orthogonal direction are required at the end of each scan portion 202 before moving to the next scan portion in scan path 200, as shown in FIG. 7. The exposure is performed by a single radiation pulse of such brief duration that the movement of workpiece W during the pulse duration is usually negligible. By way of example, for a laser radiation source emitting radiation pulses with a temporal pulse length of 10 ns and a workpiece stage moving a workpiece at 500 mm/s, the smearing of the image is only 5 nm, which is 5% of a 100 nm minimum linewidth image. This amount of image smear would have a negligible effect on the mask imagery, i.e. the amplitude of maximum modulation frequency corresponding to a minimum feature would be reduced by an imperceptible amount.

To reiterate, in the present invention the allowable smear in the mask image is surprisingly large. The variation in modulation amplitude due to image smear is given by:

$$\text{Modulation Amplitude Reduction} = 1 - (1/x)\sin(x) \quad (7a)$$

wherein $$x = \pi(\text{smear distance})/2(\text{minimum feature size}) \quad (7b)$$

A motion of 10% of the minimum feature size reduces the modulation amplitude by 0.4%, which in lithographic terms is negligible. A motion corresponding to 40% of the minimum feature size reduces the modulation amplitude by only 6.45%, and it requires an image smear equal to double the minimum feature size to reduce the image modulation amplitude to zero. Accordingly, the present invention allows for exposures to be performed "on-the-fly," i.e., without stopping the movement of workpiece stage 50 during the single-pulse exposures.

Alignment System

With continuing reference to FIG. 1, system 10 includes alignment system 72 arranged adjacent workpiece stage 50 so as to be in optical communication with workpiece W and in electrical communication with stage position control system 60. Alignment system 72 is used, for example, to align mask image MI projected through projection lens 40 to a pattern on workpiece W. With reference again to FIG. 6, alignment system 72 operates, in one example, by illuminating and imaging alignment marks 206 in a kerf region 210 between exposure fields EF. An exemplary alignment system 72 suitable for use in the present invention is disclosed in U.S. Pat. No. 5,621,813, which patent is incorporated by reference herein.

Briefly, and as discussed further below, In a preferred embodiment, alignment system 72 finds the locations of 2 to 10 exposure fields EF on workpiece W, best-fits a distorted grid to these locations taking into account variations in x-mag, y-mag, skew, x-keystone, y-keystone, etc. and then uses the best-fit, distorted grid to predict the locations of all the exposure fields.

Workpiece Handling System

With reference again to FIG. 1, system 10 also includes a workpiece handling system 80 electrically connected to controller 90 and in operable communication with workpiece stage 50. Workpiece handling system 80 is capable of delivering one or more workpieces W from workpiece storage unit 84 to workpiece stage 50, and returning them from the workpiece stage for storage in the workpiece storage unit.

The benefits of an automated workpiece handling system 80 can be appreciated by considering the rapidity by which workpieces can be exposed using system 10 of the present invention as calculated below in Table 2. As indicated in Table 2 below, the time needed to insert, align and remove a workpiece is significant in the calculation for throughput. Accordingly, an automated workpiece handling system is preferred to minimize workpiece-handling time in order to maintain a high throughput.

System Controller

System 10 includes a system controller 90 that controls and coordinates the operation of radiation source controller 16, optional pulse stabilization system 18, workpiece stage position control system 60, focus system 70, alignment system 72, and workpiece handling system 80 via electrical signals. An exemplary system controller 90 is a personal computer or workstation, such as is available from any one of a number of well-known computer companies, such as Dell Computer, Austin, Tex. Controller 90 preferable contains any of a number of commercially available microprocessors, such as the Intel PENTIUM™ series, or the AMD K6 or K7 processor, a suitable bus architecture to connect the processor to a memory device, such as a hard disk drive, and suitable input and output devices, such as a key board and a display screen, respectively. Computer system 90 is programmable to carry out the necessary control steps for operating system 10 according to the methods described below.

Throughput

TABLE 1

Comparison of throughput for different lithographic technologies

| Parameter | Step-and-Repeat | Step-and-Scan | Flash-on-the-Fly |
|---|---|---|---|
| Field size (mm) | 22 × 22 | 26 × 33 | 11 × 11 |
| Fields/300 mm Wafer | 146 | 82 | 584 |
| Step/Scan time (seconds) | 0.250 | 0.370 | 0.050 |
| Exposure time (seconds) | 0.025 | — | — |
| Total time to expose workpiece (seconds) | 40.15 | 30.34 | 30.3 |
| Input/output time (seconds) | 15 | 15 | 15 |
| Total time per workpiece (seconds) | 55.15 | 45.34 | 45.3 |
| Throughput (W/hr). | 65 | 79 | 79.5 |

A throughput comparison based on 300 mm diameter workpieces (W) for three different lithography technologies is presented above in Table 1. The technologies include the prior art step-and-repeat and step-and-scan technologies along with the new technology of the present invention, continuous lithography. The throughput of the step-and-repeat system is determined primarily by the time to move the workpiece from one position to another and to settle the workpiece stage sufficiently to expose the minimum geometry size.

The parameters of the continuous lithography system of the present invention (i.e., system 10) as listed in Table 1 assumes a radiation source with a repetition rate of 20 Hz, and a workpiece stage scan speed of 220 mm/sec, which is sufficient to print 20 separate exposure fields per second. This scanning speed is slightly slower than that of the step-and-scan system (250 mm/sec), but the effective field size for the continuous lithography system can be considered the entire row $r_n$ of exposure fields. The flash-on-the-fly system of the present invention accelerates or decelerates at the end of each row. For the continuous lithography system in Table 1, the number of accelerations and decelerations is 27, compared to 82 for the step-and-scan system. In all cases, a laser radiation source is assumed, and the exposure time is a negligible part of the total cycle time of the workpiece.

Generally, a step-and-scan system benefits from having a larger field size and fewer exposures. However, the scanning time of such a system is limited by the maximum mask-scanning rate, which is about 1 meter/second, and the time needed to accelerate and decelerate the mask with each and every field. Notable in Table 1 is the ability of the continuous lithography technology of the present invention to print almost an order of magnitude more exposure fields than the other technologies, while still maintaining a slightly greater overall throughput.

Tables 2 and 3 below lists several key parameters for an exemplary lithography system 10 to illustrate the system's throughput capability. Table 2 sets forth parameters corresponding to a lithography system 10 having a small lens field (i.e., an 11 mm×11 mm field on the workpiece), while Table 3 sets forth identical parameters for a lithography system 10 having a large lens field (22 mm×22 mm at the workpiece).

TABLE 2

Parameters for exemplary lithography system with small lens field

| | |
|---|---|
| Workpiece size and type | 300 mm wafer with an area of 707 cm$^2$ |
| Lens/Exposure field size | 1.1 cm × 1.1 cm = 1.21 cm$^2$ |
| Fields per workpiece | 584 |
| # of rows of fields = $N_R$ | 27 |
| Stage scanning rate = $S_R$ | 220 mm/s = 22 cm/s |
| Radiation source rep rate | 20 Hz |
| Stage acceleration and deceleration time = $T_{AD}$ | 41 ms |
| Time for 27 turnarounds in scanning path = $T_T$ | $(N_R)(T_{AD}) = (27)(41\ ms) = 1.1\ s$ |
| Total scan length = $S_L$ | 643 cm |
| Total scan time = $T_{ST}$ | $S_L / S_R = (643\ cm) / (22\ cm/s) = 29.2\ s$ |
| Time to insert, align, remove workpiece = $T_{IAR}$ | 15 s |
| Throughput = TP | $[3600\ s/hr] / [T_{IAR} + T_T + T_{ST}] = 79.5$ wafers/hour |

As can be seen in Table 2, even with a moderate scan speed of 220 mm/s, a moderate radiation source repetition (rep) rate of 20 Hz and a small image field size of only 11 mm×11 mm, a high throughput of 79.5 workpieces per hour is obtained. It will be readily apparent that much higher throughput values are possible for higher stage scanning speeds, faster radiation pulse repetition rates and/or larger lens field sizes.

Because the continuous lithography aspect of the present invention is capable of providing high throughput even for a relatively small lens field, it provides a viable alternative to large-field systems.

With reference now to Table 3 below, with an image field of 22 mm×22 mm (i.e., 2.2 cm×2.2 cm), which is four-times the area of the projection lens of Table 2, a repetition rate of 32 Hz and a scan speed of 70.0 cm/s, a throughput of 166 workpieces per hour is possible. The throughput can readily exceed 200 workpieces per hour by increasing the repetition rate and the scan speed.

TABLE 3

Parameters for exemplary lithography system with large lens field

| | |
|---|---|
| Workpiece size and type | 300 mm wafer with an area of 707 cm$^2$ |
| Lens/Exposure field size | 2.2 cm × 2.2 cm = 4.84 cm$^2$ |
| Fields per workpiece | 146 |
| # of rows of fields = $N_R$ | 13 |
| Stage scanning rate = $S_R$ | 700 mm/s = 70 cm/s |
| Radiation source rep rate | 32 Hz |
| Stage acceleration and deceleration time = $T_{AD}$ | 145 ms |
| Time for 14 turnarounds in scanning path = $T_T$ | $(N_R)(T_{AD})$ = (13)(145 ms) = 2.03 s |
| Total scan length = $S_L$ | 319 cm |
| Total scan time = $T_{ST}$ | $S_L/S_R$ = (319 cm) / (70 cm/s) = 4.6 s |
| Time to insert, align, remove workpiece = $T_{IAR}$ | 15 s |
| Throughput = TP | [3600 s/hr] / [$T_{IAR} + T_T + T_{ST}$] = 166 wafers/hr |

Method of Operation: Flash-on-the-fly Mode

Figure 8:
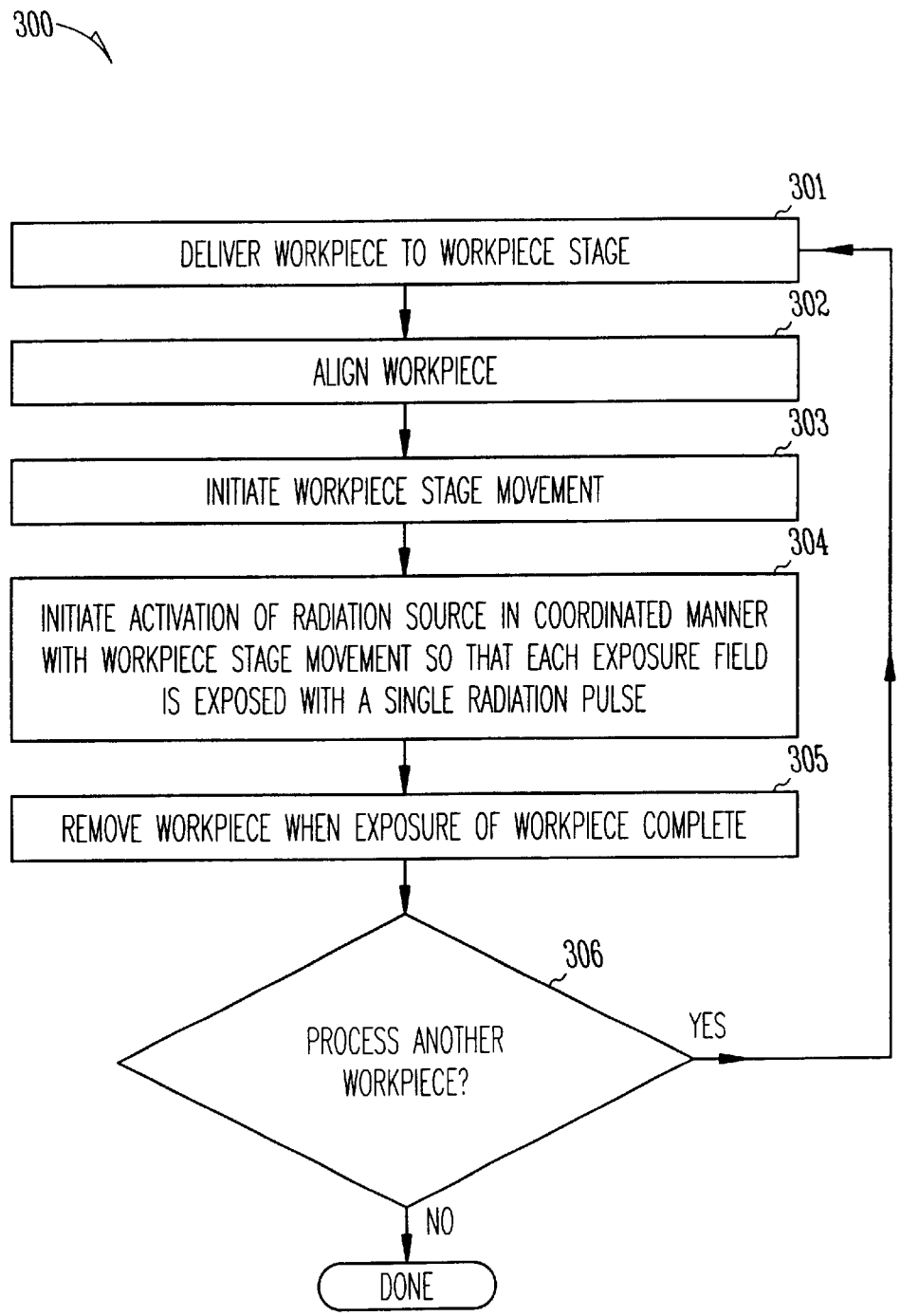
FIG. 8 is a flow diagram of the steps for operating the cost-effective lithography system of FIG. 1 so that each exposure field is created by single radiation pulse.

With continuing reference to FIG. 1 and the flow chart 300 of FIG. 8, the operation of system 10 and methods of performing rapid exposures of a workpiece associated therewith is now described.

First, in step 301, if there is no workpiece W present on workpiece stage 50, controller 90 sends an electronic signal to workpiece handling system 80 to initiate the delivery of a workpiece from workpiece storage unit 84 to the workpiece stage 50 and upper surface 52.

Once workpiece W is placed on workpiece stage 50, then in step 302 controller 90 sends electronic signals to focus system 70 and alignment system 72 to initiate focus and alignment of workpiece W with lens image field IF. Focus system 70 is used to position workpiece W at the best focus position of projection lens 40 via controller 90 sending an electrical signal to stage position control system 290. Alignment system 72 measures the alignment state of workpiece W by, in one example, imaging and analyzing the position of alignment marks 206 (FIG. 6) and executing a calibration procedure that measures the offset between the alignment system axis and the position on the workpiece of the projected image of alignment marks 206. This alignment information is sent via an electronic signal to controller 90. Controller 90 in turn sends an electronic signal to stage position control system 60, which positions the workpiece so as to be properly aligned with respect to the mask image MI (or image field IF), and placed at the best focus (or at least to within the depth of focus) of projection lens 40. This focus and alignment process requires iterative movements of workpiece W to measure the alignment errors at different points across the workpiece W and to level the workpiece with respect to the projection lens focal plane and thus achieve the optimal workpiece position. The alignment step is generally carried out so that mask image MI contained in image field IF will be aligned to workpiece exposure fields EF previously exposed onto workpiece W.

In a preferred embodiment, alignment system 72 locates the position of a plurality (e.g., 5 to 10) exposure fields EF spread across a portion of image-bearing surface WS of workpiece W. An algorithm in alignment system 72 (or in controller 90) is then used to model the distortion associated with the positions of the previous images placed on workpiece surface WS, i.e., x-mag, y-mag, skew, keystone, etc. The precise location of every exposure field EF is then computed. Based on the computed exposure field locations, workpiece W is exposed by scanning over the predicted locations for each exposure field and pulsing the radiation source once at each exposure field location.

Once workpiece W is properly aligned and focused, then in step 303 controller 90 sends an electrical signal to stage position control system 60 to scan workpiece stage 50 underneath projection lens 40. Workpiece stage 50 is preferably moved continuously so that multiple exposure fields EF can be exposed over the workpiece, such as by using scanning path 200, as shown in FIG. 7. The speed of workpiece stage 50 may be limited by the temporal pulse length but more typically will be determined by the repetition rate of the exposure radiation source 14 and the distance between exposure fields, as discussed above. Exemplary values are provided in Tables 2 and 3, above. Also as discussed above, the motion of the stage is preferably at constant velocity, but a variable velocity due to stage accelerations and decelerations can be accommodated.

In conjunction with step 303, in step 304 controller 90 sends an electronic signal to radiation source controller 16, which initiates the activation of radiation source 14 via an electronic signal, whereupon radiation source 14 provides along axis A1 pulses of radiation each having a predetermined amount of energy. For applications involving the exposure of deep UV photoresist, the energy in each pulse is preferably in the range of 5 to 50 mJ/cm$^2$. The radiation from radiation source 14 passes through illumination system 24, which uniformly illuminates mask M. Radiation passing through and diffracted by mask M is collected by projection lens 40 and is imaged onto workpiece W to form mask image MI (FIG. 4) at a predetermined location as determined by alignment system 72. Mask image may be formed in juxtaposed registration over a pre-exposed exposure field EF.

Radiation source controller 16 controls the emission of the radiation pulses from radiation source 14 based on information received from metrology device 62, as described above. Workpiece stage positioning system 60 controls the position and thus the scan trajectory of workpiece stage 50. In this fashion, workpiece W is exposed with a radiation pulse each time the workpiece trajectory crosses a point where the mask image is aligned with one of the previously exposed fields EF or some other reference (e.g., the edges of the workpiece).

Thus, each pulse of radiation prints a single mask image MI. The continuous motion of the workpiece beneath projection lens 40 during each radiation pulse, as well as during the time between radiation pulses, results in the formation of separate (i.e., non-overlapping) exposure fields each formed by a single radiation pulse and each having essentially the size of the mask pattern 34 times the demagnification of projection lens 40. Thus, sequential (i.e., temporally adjacent) radiation pulses correspond to sequential (i.e., spatially adjacent) exposure fields formed on the workpiece.

In an exemplary embodiment, step 304 includes the optional step of stabilizing the pulse-to-pulse uniformity of radiation source 14 via pulse stabilization system 18.

With continuing reference to FIG. 8 and flow diagram 300, once a workpiece is fully exposed with a desired number of exposure fields EF, then in step 305, controller 90 sends an electronic signal to workpiece handling system 80 to remove workpiece W from workpiece stage 50 and replace the workpiece with another workpiece from workpiece storage unit 84. Query step 306 then asks whether another workpiece should be exposed. If the answer is "yes," then steps 301–305 are repeated for the new workpiece and subsequent workpieces until a desired number of workpieces have been processed.

Method of Operation; Step-and-repeat Mode

As mentioned above, in addition to the continuous lithography mode of operation, a conventional "step-and-repeat" mode of operation can be used. The step-and-repeat mode of operation is similar to that of the continuous lithography mode as described above, with the following exceptions. In step 303, controller 90 sends an electrical signal to stage position control system 60 to step workpiece stage 50 underneath projection lens 40. In combination therewith, in step 304, controller 90 sends an electronic signal to radiation source controller 16, which initiates the activation of radiation source 14 via an electronic signal. Radiation source 14 then provides along axis A1 a burst of pulses of radiation each having a predetermined amount of energy so that the entire burst of radiation has sufficient energy to properly expose the image-bearing surface of the substrate. Here, a burst of radiation pulses means two or more pulses, and typically includes 100 or more pulses.

The operational mode of system 10 of the present invention is set by controller 90 via human intervention (i.e., by an operator) or by programming the controller. Thus, the system owner is provided with the option of operating the tool in either the continuous lithography operational mode or the step-and-repeat mode, depending on the application.

The present invention is a cost-effective lithography system that, in a preferred embodiment, employs a substantially smaller projection lens field size than that of conventional lithography projection lenses to achieve cost savings in the initial cost of the lithography system as well as the ongoing cost of the masks. These saving more than compensate for the reduced throughput of such a system when used in a conventional step-and-repeat mode of operation on jobs requiring fewer than 3000 substrates per mask. This system concept also lends itself to a continuous lithography mode of lithography, a new lithography technology that involves continuously moving the workpiece stage while single-pulses of radiation expose fields lying on the scan path trajectory. This mode of operation has the advantage of rapidly exposing all the fields covering an entire workpiece, so that a high throughput can be maintained, even for lithographic systems having small image field (e.g., 11 mm×11 mm) projection lenses. For large-field projection lenses, the present invention is capable of throughputs of 200 workpieces per hour or more, which is roughly twice the throughput available from prior art lithographic technologies. Further, the present invention allows for cost-effective manufacturing by allowing throughput comparable to a step-and-scan system with a continuous lithography system having a smaller lens and a stationary, smaller mask.

A major advantage of the present invention is that is capable of both a continuous lithography mode of operation as well as the conventional step-and-repeat operation, so that the lithography system owner can choose the mode of operation depending on the manufacturing needs. This makes the purchase of a small-field lithography system an option that, to date, has generally not been available because of the limited use the system would see.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A lithography system capable of rapidly, and repeatedly, exposing an entire mask having a single pattern to form a plurality of spaced-apart exposure fields on a workpiece, comprising:

a radiation source capable of emitting pules of radiation each having a temporal pulse length of one millisecond or less and a pulse-to-pulse energy variation of 10% ($3\sigma$) or less;

an illuminator arranged to receive each pulse of radiation from said radiation source to illuminate the entire mask;

a projection lens arranged to receive each pulse of radiation passing through the mask and adapted to form a full mask image in a separate exposure field on the workpiece by each pulse;

a workpiece stage capable of supporting the workpiece and moving the workpiece over a scan path;

a workpiece stage position control unit in operable communication with said workpiece stage to control the movement of said workpiece stage over said scan path and to generate workpiece stage location information; and a radiation source controller in operative communication with said radiation source and said workpiece stage position control unit receive position information from said workpiece stage position control unit to coordinate the emission of each pulse of radiation from the radiation source with the position of the workpiece stage such that each radiation pulse is provided to expose a different spaced-apart exposure field on the workpiece with the same full mask image at each desired position along said scan path in forming the plurality of separate and spaced-apart exposure fields on the workpiece.

2. A system according to claim 1, further including an alignment system in electrical communication with said workpiece stage position control system and in operable communication with the workpiece, to control the trajectory of the stage with respect to previously laid down patterns in exposure fields on the workpiece in at least one previous layer to sequentially align each exposure field on the workpiece relative to the mask image at each desired position along the scan path.

3. A system according to claim 2, wherein said radiation source controller causes said radiation source to emit a pulse to expose each existing exposure field to overlay a previously laid down pattern therein.

4. A system according to claim 1, wherein said workpiece includes an image-bearing surface, and each radiation pulse has energy sufficient to expose but not ablate the image-bearing surface.

5. A system according to claim 4, wherein each radiation pulse delivers an exposure dose in the range between 1 and 500 $mJ/cm^2$ as measured at the workpiece.

6. A system according to claim 1, wherein said radiation source is capable of emitting pulses of radiation at a repetition rate of between 1 and 100 Hz.

7. A system according to claim 1, wherein the projection lens has a reduction magnification of 4× or greater.

8. A system according to claim 1, wherein the projection lens is an on-axis catadioptric lens design having a reduction ratio between 4× and 8×, and an image field less than 2.2 $cm^2$ and an image-side numerical aperture of 0.6 or greater.

9. A system according to claim 1, wherein the projection lens is a Wynne-Dyson lens design having a unity reduction ratio.

10. A system according to claim 1, wherein the projection lens has a rectangular image field circumscribed by a circular image field of 16 mm diameter.

11. A system according to claim 1, wherein said workpiece stage is one of an air-bearing stage and a magnetically levitated stage capable of moving at a velocity between 50 mm/s and 5000 mm/s.

12. A system according to claim 2, further including a workpiece handling system in operable communication with said workpiece stage to place and remove workpieces to and from said workpiece stage.

13. A system according to claim 2, further including a system controller electrically connected to said alignment system, said workpiece stage position control system, said radiation source control system, and said workpiece handling system.

14. A system according to claim 1, wherein said radiation source is a solid state laser operating with $m^4$ spatial modes and having a $m^4$ value of 1000 or greater.

15. A system according to claim 1, wherein said radiation source includes a flash lamp.

16. A system according to claim 14, wherein said solid-state laser is a multi-mode, frequency-multiplied, YAG laser operating at a wavelength of 266 nm, 213 nm, 177 nm or 152 nm.

17. A system according to claim 14, wherein said solid state laser is a multi-mode, frequency-multiplied and frequency mixed YAG laser operating at a wavelength of 240 nm, 193 nm or 157 nm.

18. A system according to claim 14, wherein said solid-state laser is a multi-mode, frequency-multiplied, alexandrite laser operating at a wavelength of 248 nm, 193 nm or 157 nm.

19. A system according to claim 1, wherein said radiation source is a Xenon plasma source operating at a wavelength in the 6 nm–14 nm wavelength region.

20. A system according to claim 1, wherein said radiation source is an excimer laser operating at a wavelength of 248 nm, 193 nm or 157 nm.

21. A system according to claim 1, further including a pulse stabilization system.

22. A system according to claim 1, wherein said radiation source is capable of generating radiation pulses having a temporal pulse length between 1 nanosecond and 1 millisecond.

23. A system to rapidly expose a workpiece repeatedly with the same image of an entire mask having a single pattern to form a plurality of spaced-apart exposure fields on the workpiece using a single radiation pulse per exposure field, comprising, in order along an optical axis:
  a radiation source to provide pulses of radiation having a pulse-to-pulse uniformity of 10% (3σ) or less;
  an illuminator arranged to receive said pulses of radiation and substantially uniformizing each radiation pulse over the mask plane;
  a mask holder capable of supporting the mask that is to be substantially uniformly illuminated by each radiation pulse exiting the illuminator;
  a projection lens having an object plane arranged at or near the mask, an image plane arranged at or near the workpiece, and an image field within said image plane, said projection lens arranged to receive radiation transmitted through the mask to form a full mask image on the workpiece within said image field; and
  a workpiece stage to support the workpiece at or near said image plane and adapted to move the workpiece over a scan path at a velocity that allows each pulse of radiation to expose a different adjacent spaced-apart exposure field with the same full mask image without appreciably smearing each full mask image on the workpiece in the various exposure fields.

24. A system according to claim 23, further including a workpiece stage position control system operatively connected to said workpiece stage, to control movement of said workpiece stage over said scan path.

25. A system according to claim 23, further including a pulse stabilization system to enhance the stability of the pulse-to-pulse energy uniformity of the radiation pulses from the radiation source.

26. A system according to claim 24, further including a radiation source control system operatively connected to said radiation source and said workpiece stage position control system, to coordinate and control the operation of the radiation source with respect to the position of the workpiece along said scan path.

27. A system according to claim 23, wherein said workpiece includes an image-bearing surface, and each radiation pulse has energy sufficient to expose but not ablate the image-bearing surface.

28. A system according to claim 27, wherein the image-bearing surface is photoresist.

29. A system according to claim 23, wherein each radiation pulse delivers an exposure dose in the range between 1 and 500 mJ/cm$^2$ as measured at the workpiece.

30. A system according to claim 23, wherein said radiation source is capable of emitting pulses of radiation at a rate of between 1 and 500 Hz.

31. A system according to claim 23, wherein the reduction magnification of the projection lens is 4× or greater.

32. A system according to claim 23, wherein the projection lens has a reduction magnification of 1×.

33. A system according to claim 23, wherein the projection lens has a rectangular image field circumscribed by a circular image field of 16 mm diameter.

34. A system according to claim 27, further including an alignment system in operative communication with said workpiece stage and in optical communication with the workpiece, to align the workpiece relative to said mask image.

35. A system according to claim 34, further including a workpiece handling system in operable communication with said workpiece stage to place and remove workpieces to and from said workpiece stage.

36. A system according to claim 35, further including a system controller electrically connected to, and to coordinate the control of, said alignment system, position of said workpiece stage, said radiation source, and said workpiece handling system.

37. A system according to claim 23, wherein said workpiece stage is an air-bearing stage or a magnetically levitated stage capable of moving the workpiece at a velocity up to 5000 mm/s.

38. A system according to claim 23, wherein said radiation source is a solid state laser operating with $m^4$ multiple spatial modes and having a value $m^4$ of 1000 or greater and having a pulse-to-pulse variation of 10% (3σ) or less.

39. A system according to claim 38, wherein said solid-state laser is a multi-mode, frequency-multiplied, YAG laser operating at a wavelength of 266 nm, 213 nm, 177 nm or 152 nm.

40. A system according to claim 38, wherein said solid state laser is a multi-mode, frequency-multiplied and frequency-mixed YAG laser operating a wavelength of 248 nm, 193 nm or 157 nm.

41. A system according to claim 23, wherein said radiation source is a Xenon plasma source operating at a wavelength in the 6 nm–20 nm wavelength region.

42. A system according to claim 23, wherein said radiation source is an excimer laser operating at wavelength 248 nm, 193 nm or 157 nm.

43. A system according to claim 23, wherein said radiation source is flash lamp operating at wavelength between about 350 nm and about 450 nm.

44. A system according to claim 23, wherein said radiation source is capable of generating said radiation pulses each having a temporal pulse length between 1 nanosecond and 1 millisecond.

45. A system according to claim 23, wherein said illuminator includes, in order along the optical axis from said radiation source:
 a first beam transport optical system;
 a diffuser;
 an optical integrator; and
 a second beam transport optical system.

46. A system according to claim 45, wherein said illuminator system further includes:
 beam diagnostic subsystem to measure the pulse-to-pulse energy variation of the radiation pulses.

47. A method of forming multiple spaced-apart exposure fields on a workpiece with a projection lens having an object plane at which a mask having a single pattern is supported, and an image plane with an image field within which a full mask image is formed, the method comprising the steps of:
 a) continuously moving the workpiece relative to the image field in a scan path;
 b) irradiating the mask with a single radiation pulse each time a position on the workpiece where a different exposure field is to be formed is aligned with the image field with said radiation pulse being one of a sequence of such pulses having a pulse-to-pulse exposure dose variation of 10% (3σ) or less and a uniformity variation over the object plane of 10% (3σ) or less; and
 c) collecting, with the projection lens, a portion of each radiation pulse transmitted through the mask to form a full mask image for each radiation pulse in the image field;
 wherein each time the mask is illuminated with one radiation pulse, the mask image in the image field forms a corresponding separate spaced-apart exposure field on the workpiece.

48. A method according to claim 47, wherein said step b) includes the step of:
 d) aligning the mask image to one or more pre-existing exposure field on the workpiece.

49. A method according to claim 47, wherein:
 the workpiece has an image-bearing surface; and step b) includes the step of:
  d) providing each radiation pulse with enough energy to expose but not ablate the image-bearing surface.

50. A method according to claim 47, wherein said step b) includes the step of:
 d) operating a solid-state laser with a $m^4$ spatial modes and having a value of $m^4$ of 1000 or greater.

51. A method according to claim 47, wherein said step b) includes the step of:
 d) evenly distributing each radiation pulse over the mask plane by passing each radiation pulse through an illuminator system located between the radiation source and the mask.

52. A method according to claim 47, wherein said step b) includes the step of:
 d) providing the radiation pulses at a repetition rate of between 1 Hz and 500 Hz.

53. A method according to claim 47, wherein said step b) includes the step of:
 d) providing the radiation pulses with sufficient energy such that the exposure dose from a single pulse at the workpiece has a value between 1 $mJ/cm^2$ and 500 $mJ/cm^2$.

54. A method according to claim 47, further includes the step of:
 d) defining the image field to be a rectangular section of a circular image field of 16 mm diameter.

55. A method according to claim 47, wherein said step a) includes the step of:
 d) moving the workpiece at a constant velocity.

56. A method according to claim 47, further includes the step of:
 d) monitoring the energy of each of the radiation pulses.

57. A method according to claim 47, wherein said step c) includes the step of:
 d) forming the separate exposure fields in juxtaposed registration with pre-existing, separate spaced-apart exposure fields with previously laid down patterns therein.

58. A method according to claim 47, wherein:
 the mask pattern has a minimum feature size, the radiation pulses have a repetition rate and a temporal pulse length, and the workpiece has a scan speed; and
 the method further includes the step of:
  d) selecting the repetition rate, the scan speed and the temporal pulse length such that each mask image forming each exposure field is blurred by no more than 20% of the minimum feature size.

59. A method according to claim 47, wherein:
 the mask pattern has a minimum feature size defining a mask image modulation frequency, the radiation pulses have a repetition rate and a temporal pulse length, and the workpiece has a scan speed; and
 the method further includes the step of:
  d) selecting the repetition rate, the scan speed and the temporal pulse length such that each mask image forming each exposure field is blurred by an amount that reduces the amplitude of the maximum mask image modulation frequency by 34.6% or less.

60. A method according to claim 47, wherein the mask has a cost that is amortized over exposing 3000 workpieces or less.

61. A method according to claim 47, further includes the step of:
 d) sending the radiation pulses through a pulse stabilization system to improve the pulse-to-pulse energy uniformity.

62. A method of rapidly forming a plurality of sequentially arranged, spaced-apart exposure fields on a workpiece with a projection lens having an object plane, an image plane and an image field, comprising the steps of:
 a) supporting a mask having a single pattern at or near the object plane;
 b) arranging a workpiece stage on which the workpiece is mounted to be movable within the image plane over a scan path relative to the image field with the workpiece having sequentially arranged, spaced-apart exposure fields to be formed;

c) continuously moving the workpiece stage over the scan path; and d) irradiating the mask with a single radiation pulse and collecting the transmitted radiation pulse with the projection lens to form a full mask image within the image field each time the workpiece is aligned relative to the image field to form a different one of the adjacent, spaced-apart exposure fields.

63. A method according to claim 62, wherein the adjacent exposure fields are formed in registered juxtaposition with pre-existing exposure fields formed on the workpiece.

64. A method according to claim 62, wherein step d) includes the step of:

e) providing the pulses of radiation from a solid-state laser having a number of spatial modes $m^4$ and having a value $m^4$ of 1000 or greater.

65. A method according to claim 62, wherein step d) includes the step of:

e) providing the pulses of radiation from a flash lamp operating in the near UV part of the spectrum.

66. A method according to claim 62, wherein:

the workpiece has an image-bearing surface; and the method further includes the step of:

e) providing each radiation pulse with enough energy to expose but not ablate the image-bearing surface.

67. A method according to claim 62, wherein:

the mask defines a mask plane; and step d) includes the step of:

e) spreading each radiation pulse uniformly across the mask plane by passing each radiation pulse through an illuminator arranged upstream of the mask.

68. A method according to claim 62, wherein step d) includes the step of:

e) providing the radiation pulses at a repetition rate of between 1 Hz and 500 Hz.

69. A method according to claim 62, wherein step d) includes the step of:

e) providing radiation pulses with sufficient energy to provide an exposure dose at the image plane of between 1 mJ/cm$^2$ and 500 mJ/cm$^2$.

70. A method according to claim 62 further includes the step of:

e) defining a rectangular image field that fits within a circular image field of 16 mm in diameter.

71. A method according to claim 62, wherein step c) includes the step of:

e) moving the workpiece at a constant velocity.

72. A method according to claim 62, wherein the pulses of radiation have a pulse-to-pulse variation in energy that is less than 10% (3σ).

73. A method according to claim 62, wherein the pulses of radiation have a pulse-to-pulse variation in energy that is less than 1% (3σ).

74. A method according to claim 62, wherein:

the mask pattern has a minimum feature size; and steps c) and d) are performed such that each exposure field contains a full mask image with the amount of blurring, due to continuously moving the workpiece stage, being less than 20% of said minimum feature size.

75. A method according to claim 62, wherein:

the mask pattern has a minimum feature size, the mask image has a maximum modulation frequency based on the minimum feature size; and steps c) and d) are performed such that each exposure field contains a full mask image with the amount of blurring, due to continually moving the workpiece stage during the mask irradiation step, decreases the amplitude of the maximum modulation frequency corresponding to the minimum feature size by less than 36.4%.

76. A lithography system capable of cost-effectively patterning a workpiece in the manufacturing of semiconductor devices in a semiconductor manufacturing environment, comprising:

a mask with a patterned area having a single pattern to be repeatedly imaged onto the workpiece and having a cost that is amortized over processing 3000 workpieces or less;

a radiation source and illumination system operatively arranged to illuminate the mask with a series of spatially uniformized pulses of radiation;

a reduction projection lens with an output end having numerical aperture NA and demagnification of 5× or greater, arranged adjacent the mask to receive pulses of radiation passing through the mask, the lens being designed to form a full mask image of the mask pattern onto the workpiece over a different, spaced-apart exposure field with each pulse, each exposure field having a maximum area of 2 cm$^2$ or less; and a workpiece stage and workpiece stage position control system to move the workpiece under the projection lens.

77. A system according to claim 76, wherein the movement of the workpiece by said workpiece stage and said workpiece stage position control system is continuous during exposure of a plurality of separate spaced-apart exposure fields with said pulses of radiation.

78. A system according to claim 76, further including an alignment system in electrical communication with the workpiece stage position control system and in operable communication with the workpiece to align the workpiece relative to the mask image.

79. A system according to claim 76, wherein the radiation source emits radiation having a wavelength of 248 nm or shorter.

80. A system according to claim 79, wherein the projection lens has a numerical aperture of 0.6 or greater.

81. A system according to claim 80, wherein the projection lens is a four-mirror on-axis catadioptric optical system having an image plane, with one of the four mirrors being a Mangin mirror disposed adjacent the image plane.

82. A lithography system operating at a wavelength λ and numerical aperture NA capable of cost-effectively patterning a workpiece having an image-bearing surface with a plurality of spaced-apart exposure fields, comprising:

a mask with a single patterned area to be imaged entirely onto the workpiece as a mask image having a minimum feature size of 0.5 λ/NA or smaller, the mask having a cost that is amortized over processing 3000 workpieces or less;

a pulsed radiation source capable of emitting pulses of radiation having a temporal duration of 10 microseconds or less, wavelength λ , a repetition rate between 1 Hz and 50 Hz, and each pulse having energy sufficient to expose but not ablate the image bearing surface;

an illumination system operatively arranged to receive render and spatially uniformize single pulses of radiation from the radiation source and to illuminate the mask with the spatially uniform pulses of radiation;

a reduction projection lens with an output end having numerical aperture NA and reduction magnification of 5× or greater, arranged adjacent the mask to receive pulses of radiation passing through the mask, the lens being designed to form a full mask image onto the workpiece over each spaced-apart exposure field having a maximum rectangular area of 2.2 cm$^2$ or less with each pulse of radiation imaging a different spaced-apart exposure filed on the workpiece; and a workpiece stage to continuously transport the workpiece under the projection lens output end and over a scan path at a scan velocity in a coordinated manner with the emission of radiation pulses from the radiation source such that each spaced-apart exposure field is formed from a single full mask image by a single pulse of radiation.

83. A system according to claim 82, wherein the radiation source has a pulse-to-pulse energy dose variation less than 5% (3σ).

84. A system according to claim 82, wherein the radiation source has temporal pulse duration that is less than the minimum feature size divided by the scan velocity.

85. A system according to claim 82, wherein the radiation source has a wavelength λ of 248 nm or shorter.

86. A system according to claim 82, wherein the projection lens NA is 0.6 or greater.

87. A system according to claim 82, wherein the projection lens has a corrected spectral range of one Angstrom or greater.

88. A pulse stabilization system to stabilize the pulse-to-pulse energy of a beam of radiation pulses emitted from a radiation source along an optical path, comprising:

a detector arranged downstream of the radiation source to detect a portion of radiation emitted from the radiation source and produce an electrical signal corresponding to the detected radiation;

an integration circuit electrically connected to the detector to integrate the electrical signal from the detector and provide an integrated electrical signal;

a programable threshold detector coupled to said integration circuit to receive the integrated electrical signal and programed with a threshold value to generate an activation signal when the integrated electrical signal reaches the threshold value;

a Pockels cell driver electrically connected to the programable threshold detector;

a Pockels cell, electrically connected to the Pockels cell driver, responsive to said activation signal and arranged in the optical path; and a delay line, in the optical path between the radiation source and the Pockels cell, designed such that activation of the Pockels cell via the activation signal serves to truncate the radiation pulse responsible for generating the activation signal leaving the radiation pulse with an amount of energy corresponding substantially to the threshold value.

89. A system according to claim 88, further including:

an optical system arranged adjacent the light source in the optical path to divide the radiation pulses along first and second optical paths each having associated therewith a different polarization; and a half-wave plate arranged in one of the first and second optical paths to make the radiation pulses in the first and second optical paths have the same polarization;

wherein said optical system directs the first and second optical paths in a common direction.

90. A system according to claim 89, wherein said optical system comprises a polarizing beam splitter and a plurality of mirrors.

91. A system according to claim 88, further including an optical system arranged in the first optical path upstream of the Pockels cell and designed so that a portion of the beam of radiation pulses is directed around the Pockels cell and recombined with the portion of the beam of radiation pulses passing through the Pockels cell.

92. A system according to claim 91, wherein the optical system includes a first beam splitter arranged in the first optical path upstream of the Pockels cell and a second beam splitter arranged downstream of the Pockels cell.

93. A pulse stabilization system to stabilize the pulse-to-pulse output of an output beam of radiation pulses formed by a first beam of radiation pulses emitted from a first radiation source along a first optical path, and a second beam of radiation pulses emitted from a second radiation source along a second optical path, comprising:

first means for detecting and processing a portion of the radiation emitted from the first radiation source and for producing a first integrated electrical signal;

second means for detecting and processing a portion of the radiation emitted from the second radiation source and for producing a second integrated electrical signal;

third means for receiving said first and second integrated electrical signals and generating an activation signal when said first and second integrated electrical signals reached a combined threshold value;

electro-optical means responsive to said activation signal and arranged in the first optical path to attenuate the radiation pulses in the first beam of radiation pulses; and optical means for combining the first and second beams of radiation pulses to form the combined output beam of radiation pulses that have a substantially uniform energy from pulse to pulse.

94. A lithography system to cost-effectively process 3000 workpieces or less per set of masks as compared to a conventional lithography system the cost-effective lithography system comprising in order along an optical axis:

a radiation source to provide radiation pulses;

an illuminator arranged to receive the radiation pulses and substantially spread each radiation pulse uniformly over a mask plane with a spatial uniformity of 10% (3σ) or less;

a mask holder capable of supporting one of the masks in the set of masks at the mask plane;

a workpiece stage to support a workpiece and move the workpiece relative to the optical axis; and a catadioptric projection lens having an object plane arranged at or near the mask plane, an image plane arranged at or near one of the workpieces, and an image field within the image plane, the image field having an area of about 2.2 cm$^2$ or less so that each of the masks in the mask set contains less than or equal to about half the amount of information of a mask used with the conventional lithography system;

wherein the workpiece stage is adapted to step the workpiece to allow a plurality of bursts of radiation pulses to form a corresponding plurality of exposure fields in a one pulse to one exposure field relationship on the workpiece being processed.

95. A system according to claim 94, wherein the radiation source and workpiece stage are adapted to alternatively provide single-pulse exposures of each exposure field.

96. A system according to claim 94, wherein the radiation source is a flash lamp or a laser.

97. A system according to claim 14, further including a pulse stabilization system coupled to said radiation source.

98. A system according to claim 15, further including a pulse stabilization system coupled to said radiation source.

99. A system according to claim 19, further including a pulse stabilization system coupled to said radiation source.

100. A system according to claim 20, further including a pulse stabilization system coupled to said radiation source.

* * * * *